US012751272B2

(12) United States Patent
Karda et al.

(10) Patent No.: US 12,751,272 B2
(45) Date of Patent: Sep. 29, 2026

(54) MEMORY DEVICE HAVING 2-TRANSISTOR VERTICAL MEMORY CELL AND A COMMON PLATE

(71) Applicant: Micron Technology, Inc., Boise, ID (US)

(72) Inventors: Kamal M. Karda, Boise, ID (US); Karthik Sarpatwari, Boise, ID (US); Haitao Liu, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 463 days.

(21) Appl. No.: 18/234,602

(22) Filed: Aug. 16, 2023

(65) Prior Publication Data

US 2024/0047356 A1 Feb. 8, 2024

Related U.S. Application Data

(62) Division of application No. 17/003,065, filed on Aug. 26, 2020, now Pat. No. 11,776,907.

(Continued)

(51) Int. Cl.

*H10W 20/41* (2026.01)
*G11C 5/06* (2006.01)

(Continued)

(52) U.S. Cl.

CPC ........... *H10W 20/427* (2026.01); *G11C 5/063* (2013.01); *H10B 12/01* (2023.02); *H10B 12/20* (2023.02); *H10D 62/80* (2025.01)

(58) Field of Classification Search

CPC ...... H10B 12/20; H10B 12/01; H01L 23/5286

See application file for complete search history.

(56) References Cited

U.S. PATENT DOCUMENTS 4,656,607 A 4/1987 Hagiwara et al.
5,357,464 A * 10/1994 Shukuri ................ H10B 12/00 365/185.21

(Continued)

FOREIGN PATENT DOCUMENTS

CN 1146605 A 4/1997
CN 1845330 A 10/2006

(Continued)

OTHER PUBLICATIONS

"Japanese Application Serial No. 2022-513054, Notification of Reasons for Refusal mailed Jun. 6, 2023", with English translation, 10 pages.

"European Application Serial No. 20856718.0, Partial Supplementary European Search Report mailed Aug. 4, 2023", 13 pgs.

"European Application Serial No. 20856718.0, Extended European Search Report mailed Nov. 7, 2023", 13 pgs.

Shukuri, S., "A Complementary Gain Cell Technology for Sub-1V Supply DRAMs", Ext. Abs. of IEEE Int. Electron Device Meeting, (1992), 1006-1008.

(Continued)

*Primary Examiner* — Edward Chin

(74) *Attorney, Agent, or Firm* — Schwegman Lundberg & Woessner, P.A.

(57) ABSTRACT

Some embodiments include apparatuses and methods of forming the apparatuses. One of the apparatuses includes a data line, a memory cell coupled to the data line, a ground connection, and a conductive line. The memory cell includes a first transistor and a second transistor. The first transistor includes a first region electrically coupled to the data line, and a charge storage structure electrically separated from the first region. The second transistor includes a second region electrically coupled to the charge storage structure and the data line. The ground connection is coupled to the first region of the first transistor. The conductive line is electrically separated from the first and second regions and spans across part of the first region of the first transistor and part of the second region of the second transistor and forming a gate of the first and second transistors.

20 Claims, 21 Drawing Sheets

Related U.S. Application Data

(60) Provisional application No. 62/892,982, filed on Aug. 28, 2019.

(51) Int. Cl.

| | |
|---|---|
| ***H10B 12/00*** | (2023.01) |
| ***H10D 62/80*** | (2025.01) |

(56) References Cited

U.S. PATENT DOCUMENTS

| | | | | |
|---|---|---|---|---|
| 5,448,513 | A | 9/1995 | Hu et al. | |
| 5,712,817 | A | 1/1998 | Suh | |
| 11,776,907 | B2 | 10/2023 | Karda et al. | |
| 2011/0002159 | A1 | 1/2011 | Suzuki et al. | |
| 2018/0122943 | A1 | 5/2018 | Han et al. | |
| 2019/0123277 | A1 | 4/2019 | Jeong | |
| 2019/0348424 | A1 | 11/2019 | Karda et al. | |
| 2021/0066196 | A1 * | 3/2021 | Karda | H10B 12/01 |

FOREIGN PATENT DOCUMENTS

| | | | |
|---|---|---|---|
| CN | 109698271 | A | 4/2019 |
| CN | 114303241 | A | 4/2022 |
| CN | 114365221 | A | 4/2022 |
| CN | 114365222 | A | 4/2022 |
| JP | H05110016 | A | 4/1993 |
| JP | H05243522 | | 9/1993 |
| JP | 2013153140 | | 8/2013 |
| TW | I751669 | B | 1/2022 |
| WO | 0070683 | | 11/2000 |
| WO | 2013080900 | | 6/2013 |
| WO | WO-2019066927 | A1 | 4/2019 |
| WO | WO-2021041544 | A1 | 3/2021 |
| WO | WO-2021041544 | A9 | 4/2021 |

OTHER PUBLICATIONS

"European Application Serial No. 20856718.0, Response filed Oct. 18, 2022 to Communication pursuant to Rules 161(2) and 162 EPC mailed Apr. 8, 2022", 17 pgs.

"International Application Serial No. PCT/US2020/047998, International Preliminary Report on Patentability mailed Mar. 10, 2022", 8 pgs.

"International Application Serial No. PCT/US2020/047998, International Search Report mailed Dec. 4, 2020", 4 pgs.

"International Application Serial No. PCT/US2020/047998, Written Opinion mailed Dec. 4, 2020", 6 pgs.

"Taiwanese Application Serial No. 109129636, Response filed Jul. 6, 2021 to Taiwanese Office Action mailed Apr. 6, 2021", w/ English Claims, 61 pgs.

"Taiwanese Application Serial No. 109129636, Taiwanese Office Action mailed Apr. 6, 2021", w/ English Translation, 29 pgs.

"Chinese Application Serial No. 202080060309.3, Office Action mailed May 15, 2025", with English translation, 28 pages.

"Chinese Application Serial No. 202080060309.3, Response filed Sep. 15, 2025 to Office Action mailed May 15, 2025", with English claims, 28 pages.

"European Application Serial No. 20856718.0, Communication Pursuant to Article 94(3) EPC mailed Jul. 22, 2025", 9 pages.

"European Application Serial No. 20856718.0, Response filed Jan. 22, 2026 to Communication Pursuant to Article 94(3) EPC mailed Jul. 22, 2025", 99 pgs.

"Korean Application Serial No. 10-2022-7009697, Notice of Preliminary Rejection mailed Oct. 14, 2025", with English translation, 10 pages.

* cited by examiner

MEMORY DEVICE HAVING 2-TRANSISTOR VERTICAL MEMORY CELL AND A COMMON PLATE

PRIORITY APPLICATION

This application is a divisional of U.S. application Ser. No. 17/003,065, filed Aug. 26, 2020, which claims the benefit of priority to U.S. Provisional Application Ser. No. 62/892,982, filed Aug. 28, 2019, all of which are incorporated herein by reference in their entirety.

BACKGROUND

Memory devices are widely used in computers and many other electronic items to store information. Memory devices are generally categorized into two types: volatile memory device and non-volatile memory device. A memory device usually has numerous memory cells to store information. In a volatile memory device, information stored in the memory cells is lost if supply power is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Unlike some conventional memory devices, the memory devices described herein include features that can overcome challenges faced by conventional techniques.

DETAILED DESCRIPTION

The memory device described herein includes volatile memory cells in which each of the memory cells can include two transistors (2T). One of the two transistors has a charge storage structure, which can form a memory element of the memory cell to store information. The memory device described herein can have a structure (e.g., a 4F2 cell footprint) that allows the size of the memory device to be relatively smaller than the size of similar conventional memory devices. The described memory device can include a single access line (e.g., word line) to control two transistors of a memory cell. This can lead to reduced power dissipation and improved processing. Each of the memory cells of the described memory device can include a cross-point gain cell structure (and cross-point operation), such that a memory cell can be accessed using a single access line (e.g., word line) and single data line (e.g., bit line) during an operation (e.g., a read or write operation) of the memory device. Other improvements and benefits of the described memory device and its variations are discussed below with reference to FIG. 1 through FIG. 29C.

Figure 1:
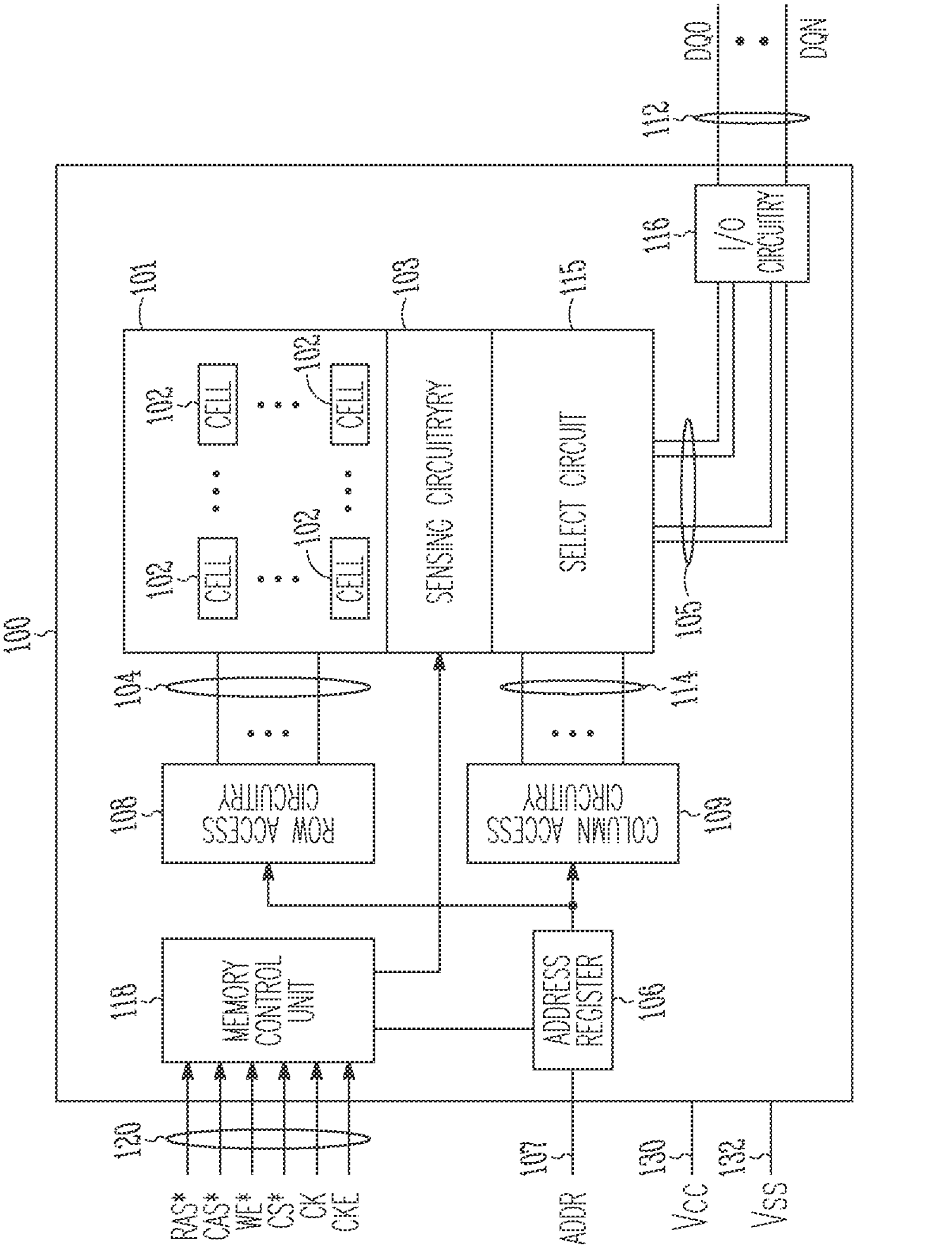
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 can include a volatile memory device such that memory cells 102 can be volatile memory cells. An example of memory device 100 includes a dynamic random-access memory (DRAM) device. Information stored in memory cells 102 of memory device 100 may be lost (e.g., invalid) if supply power (e.g., supply voltage Vcc) is disconnected from memory device 100. Hereinafter, supply voltage Vcc is referred to as representing some voltage levels; however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on supply voltage Vcc, such an internal voltage may be used instead of supply voltage Vcc.

In a physical structure of memory device 100, each of memory cells 102 can include transistors (e.g., two transistors) formed vertically (e.g., stacked on different layers) in different levels over a substrate (e.g., semiconductor substrate) of memory device 100. Memory device 100 can also include multiple levels (e.g., multiple decks) of memory cells where one level (e.g., one deck) of memory cells can be formed over (e.g., stacked on) another level (e.g., another deck) of additional memory cells. The structure of memory array 101, including memory cells 102, can include the structure of memory arrays and memory cells described below with reference to FIG. 2 through FIG. 29C.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines (e.g., address lines) 107. Memory device 100 can include row access circuitry (e.g., X-decoder) 108 and column access circuitry (e.g., Y-decoder) 109 that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1")), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or identical to any of the memory devices described below with reference to FIG. 2 through FIG. 29C.

Figure 2:
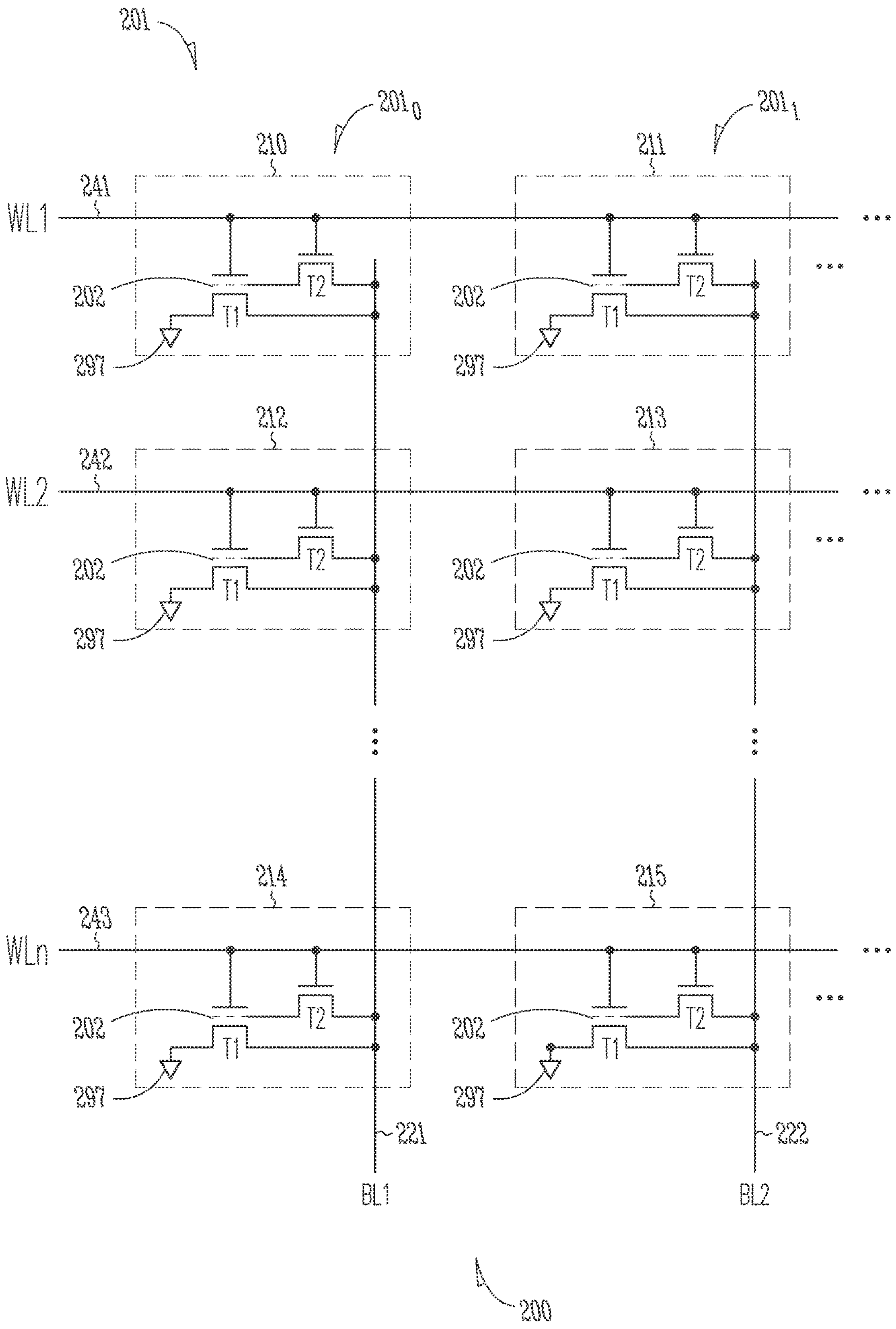
FIG. 2 shows a schematic diagram of a portion of a memory device including a memory array of two-transistor (2T) memory cells, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or identical elements among memory cells 210 through 215 are given the same labels.

Each of memory cells 210 through 215 can include two transistors T1 and T2. Thus, each of memory cells 210 through 215 can be called a 2T memory cell (e.g., 2T gain cell). Each of transistors T1 and T2 can include a field-effect transistor (FET). As an example, transistor T1 can be a p-channel FET (PFET), and transistor T2 can be an n-channel FET (NFET). Part of transistor T1 can include a structure of a p-channel metal-oxide semiconductor (PMOS) transistor FET (PFET). Thus, transistor T1 can include an operation similar to that of a PMOS transistor. Part of transistor T2 can include an n-channel metal-oxide semiconductor (NMOS). Thus, transistor T2 can include an operation similar to that of a NMOS transistor.

Transistor T1 of memory device 200 can include a charge-storage based structure (e.g., a floating-gate based). As shown in FIG. 2, each of memory cells 210 through 215 can include a charge storage structure 202, which can include the floating gate of transistor T1. Charge storage structure 202 can form the memory element of a respective memory cell among memory cells 210 through 215. Charge storage structure 202 can store charge. The value (e.g., "0" or "1") of information stored in a particular memory cell among memory cells 210 through 215 can be based on the amount of charge in charge storage structure 202 of that particular memory cell.

As shown in FIG. 2, transistor T2 (e.g., the channel region of transistor T2) of a particular memory cell among memory cells 210 through 215 can be electrically coupled to (e.g., directly coupled to) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200.

Memory cells 210 through 215 can be arranged in memory cell groups $\mathbf{201_0}$ and $\mathbf{201_1}$. FIG. 2 shows two memory cell groups (e.g., $\mathbf{201_0}$ and $\mathbf{201_1}$) as an example. However, memory device 200 can include more than two memory cell groups. Memory cell groups $\mathbf{201_0}$ and $\mathbf{201_1}$ can include the same number of memory cells. For example, memory cell group $\mathbf{201_0}$ can include memory cells 210, 212, and 214, and memory cell group $\mathbf{201_1}$ can include memory cells 211, 213, and 215. FIG. 2 shows three memory cells in each of memory cell groups $\mathbf{201_0}$ and $\mathbf{201_1}$ as an example. The number of memory cells in memory cell groups $\mathbf{201_0}$ and $\mathbf{201_1}$ can be different from three.

Memory device 200 can perform a write operation to store information in memory cells 210 through 215, and a read operation to read (e.g., sense) information from memory cells 210 through 215. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate of transistor T1. During an operation (e.g., a read or write operation) of memory device 200, an access line (e.g., a single access line) and a data line (e.g., a single data line) can be used to access a selected memory cell (e.g., target memory cell).

As shown in FIG. 2, memory device 200 can include access lines (e.g., word lines) 241, 242, and 243 that can carry respective signals (e.g., word line signals) WL1, WL2, and WLn. Access lines 241, 242, and 243 can be used to access both memory cell groups $201_0$ and $201_1$. Each of access lines 241, 242, and 243 can be structured as at least one conductive line (one conductive line or multiple conductive lines that can be electrically coupled (e.g., shorted) to each other). Access lines 241, 242, and 243 can be selectively activated (e.g., activated one at a time) during an operation (e.g., read or write operation) of memory device 200 to access a selected memory cell (or selected memory cells) among memory cells 210 through 215. A selected cell can be referred to as a target cell. In a read operation, information can be read from a selected memory cell (or selected memory cells). In a write operation, information can be stored in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Some conventional memory devices may use multiple (e.g., two separate) access lines to control access to a respective memory cell during read and write operations. In comparison with such conventional memory devices (that use multiple access lines for the same memory cell), memory device 200 uses a single access line (e.g., shared access line) in memory device 200 to control both transistors T1 and T2 of a respective memory cell to access the respective memory cell. This technique can save space and simplify operation of memory device 200. Further, some conventional memory devices may use multiple data lines to access a selected memory cell (e.g., during a read operation) to read information from the selected memory cell. In memory device 200, a single data line (e.g., data line 221 or 222) can be used to access a selected memory cell (e.g., during a read operation) to read information from the selected memory cell. This may also simplify the structure, operation, or both of memory device 200 in comparison with conventional memory devices use multiple data lines to access a selected memory cell.

In memory device 200, the gate of each of transistors T1 and T2 can be part of a respective access line (e.g., a respective word line). As shown in FIG. 2, the gate of each of transistors T1 and T2 of memory cell 210 can be part of access line 241. The gate of each of transistors T1 and T2 of memory cell 211 can be part of access line 241. For example, in the structure of memory device 200, four different portions of a conductive material (or materials) that form access line 241 can form the gates (e.g., four gates) of transistors T1 and T2 of memory cell 210 and the gates of transistors T1 and T2 of memory cell 211, respectively.

The gate of each of transistors T1 and T2 of memory cell 212 can be part of access line 242. The gate of each of transistors T1 and T2 of memory cells 213 can be part of access line 242. For example, in the structure of memory device 200, four different portions of a conductive material (or materials) that form access line 242 can form the gates (e.g., four gates) of transistors T1 and T2 of memory cell 212 and the gates of transistors T1 and T2 of memory cell 213, respectively.

The gate of each of transistors T1 and T2 of memory cell 214 can be part of access line 243. The gate of each of transistors T1 and T2 of memory cell 215 can be part of access line 243. For example, in the structure of memory device 200, four different portions of a conductive material (or materials) that form access line 243 can form the gates (e.g., four gates) of transistors T1 and T2 of memory cell 214 and the gates of transistors T1 and T2 of memory cell 215, respectively.

Memory device 200 can include data lines (e.g., bit lines) 221 and 222 that can carry respective signals (e.g., bit line signals) BL1 and BL2. During a read operation, memory device 200 can use data line 221 to obtain information read (e.g., sensed) from a selected memory cell of memory cell group $201_0$, and data line 222 to read information from a selected memory cell of memory cell group $201_1$. During a write operation, memory device 200 can use data line 221 to provide information to be stored in a selected memory cell of memory cell group $201_0$, and data line 222 to provide information to be stored in a selected memory cell of memory cell group $201_1$.

Memory device 200 can include a ground connection (e.g., ground plate) 297 coupled to each of memory cells 210 through 215. Ground connection 297 can be structured from a conductive plate (e.g., a layer of conductive material) that can be coupled to ground terminal of memory device 200. As an example, ground connection 297 can be a common conductive plate (e.g., formed under the memory cells (e.g., memory cells 210 through 215)) of memory device 200. In this example, the elements (e.g., transistors T1 and T2) of each of the memory cells (e.g., memory cells 210 through 215) of memory device 200 can be formed over (e.g., formed vertically) the common conductive plate.

As shown in FIG. 2, transistor T1 (e.g., the channel region of transistor T1) of a particular memory cell among memory cells 210 through 215 can be electrically coupled to (e.g., directly coupled to) ground connection 297 and electrically coupled to (e.g., directly coupled to) a respective data line (e.g., data line 221 or 222). Thus, a circuit path (e.g., current path) can be formed between a respective data line (e.g., data line 221 or 222) and ground connection 297 through transistor T1 of a selected memory cell during an operation (e.g., a read operation) performed on the selected memory cell.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., memory cell 210, 212, or 214) can include a current path (e.g., read current path) through a channel region of transistor T1 of that particular memory cell, data line 221, and ground connection 297. In memory cell group $201_1$, a read path of a particular memory cell (e.g., memory cell 211, 213, or 215) can include a current path (e.g., read current path) through a channel region of transistor T1 of that particular memory cell, data line 222, and ground connection 297. In the example where transistor T1 is a PFET (e.g., a PMOS), the current in the read path (e.g., during a read operation) can include a hole conduction (e.g., hole conduction in the direction from data line 221 to ground connection 297 through the channel region of transistor T1). Since transistor T1 can be used in a read path to read information from the respective memory cell during a read operation, transistor T1 can be called a read transistor and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include transistor T2 (e.g., can include a write current path through a channel region of transistor T2) of that particular memory cell and data line 221. In memory cell group $201_1$, a write path of a particular memory cell (e.g., memory cell 211, 213, or 215) can include transistor T2 (e.g., can include a write current path through a channel region of transistor T2) of that particular memory cell and data line 222. In the example where transistor T2 is an NFET (e.g., NMOS), the current in a write path (e.g., during a write operation) can include an electron conduction (e.g., electron conduction in the direction from data line 221 to charge storage structure 202) through the channel region of transistor T2. Since transistor T2 can be used in a write path to store information in a respective memory cell during a write operation, transistor T2 can be called a write transistor and the channel region of transistor T1 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (unequal values). For example, the value of threshold voltage Vt2 can be greater than the value of threshold voltage Vt1. The difference in values of threshold voltages Vt1 and Vt2 allows reading (e.g., sensing) of information stored in charge storage structure 202 in transistor T1 on the read path during a read operation without affecting (e.g., without turning on) transistor T2 on the write path (e.g., path through transistor T2). This can prevent leaking of charge (e.g., during a read operation) from charge storage structure 202 through transistor T2 of the write path.

In a structure of memory device 200, transistors T1 and T2 can be formed (e.g., engineered) such that threshold voltage Vt1 of transistor T1 can be less than zero volts (e.g., Vt1<0 V) regardless of the value (e.g., "0" or "1") of information stored in charge storage structure 202 of transistor T1, and Vt1<Vt2. Charge storage structure 202 can be in state "0" when information having a value of "0" is stored in charge storage structure 202. Charge storage structure 202 can be in state "1" when information having a value of "1" is stored in charge storage structure 202. Thus, in this structure, the relationship between the values of threshold voltages Vt1 and Vt2 can be expressed as follows: Vt1 for state "0"<Vt1 for state "1"<0 V, and Vt2=0 V (or alternatively Vt2>0 V).

In an alternative structure of memory device 200, transistors T1 and T2 can be formed (e.g., engineered) such that Vt1 for state "0"<Vt1 for state "1", where Vt1 for state "0"<0 V (or alternatively Vt1 for state "0"=0 V), Vt1 for state "1">0 V, and Vt1<Vt2.

In another alternative structure, transistors T1 and T2 can be formed (e.g., engineered) such that Vt1 (for state "0") <Vt1 (for state "1"), where Vt1 for state "0"=0 V (or alternatively Vt1 for state "0">0 V), and Vt1<Vt2.

During a read operation of memory device 200, only one memory cell of the same memory cell group can be selected at a time to read information from the selected memory cell. For example, memory cells 210, 212, and 214 of memory cell group $201_0$ can be selected one at a time during a read operation to read information from the selected memory cell (e.g., one of memory cells 210, 212, and 214 in this example). In another example, memory cells 211, 213, and 215 of memory cell group $201_1$ can be selected one at a time during a read operation to read information from the selected memory cell (e.g., one of memory cells 211, 213, and 215 in this example).

During a read operation, memory cells of different memory cell groups (e.g., memory cell groups $201_0$ and $201_1$) that share the same access line (e.g., access line 241, 242, or 243) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $201_0$ during a read operation can be determined based on the value of a current detected (e.g., sensed) from a read path (described above) that includes data line 221, transistor T1 of the selected memory cell (e.g., memory cell 210, 212, or 214), and ground connection 297. The value of information read from the selected memory cell of memory cell group $201_1$ during a read operation can be determined based on the value of a current detected (e.g., sensed) from a read path that includes data line 222, transistor T1 of the selected memory cell (e.g., memory cell 211, 213, or 215), and ground connection 297.

Memory device 200 can include detection circuitry (not shown) that can operate during a read operation to detect (e.g., sense) a current (e.g., current I1, not shown) on a read path that includes data line 221, and detect a current (e.g., current I2, not shown) on a read path that includes data line 222. The value of the detected current can be based on the value of information stored in the selected memory cell. For example, depending on the value of information stored in the selected memory cell of memory cell group $201_0$, the value of the detected current (e.g., the value of current I1) on data line 221 can be zero or greater than zero. Similarly, depending on the value of information stored in the selected memory cell of memory cell group $201_1$, the value of the detected current (e.g., the value of current I2) between data line 222 can be zero or greater than zero. Memory device 200 can include circuitry (not shown) to translate the value of a detected current into the value (e.g., "0", "1", or a combination of multi-bit values) of information stored in the selected memory cell.

During a write operation of memory device 200, only one memory cell of the same memory cell group can be selected at a time to store information in the selected memory cell. For example, memory cell 210, 212, and 214 of memory cell group $201_0$ can be selected one at a time during a write operation to store information in the selected memory cell (e.g., one of memory cell 210, 212, and 214 in this example). In another example, memory cells 211, 213, and 215 of memory cell group $201_1$ can be selected one at a time during a write operation to store information in the selected memory cell (e.g., one of memory cell 211, 213, and 215 in this example).

During a write operation, memory cells of different memory cell groups (e.g., memory cell groups $201_0$ and $201_1$) that share the same access line (e.g., access line 241, 242, or 243) can be concurrently selected. For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $201_0$ during a write operation can be provided through a write path (described above) that includes data line 221 and transistor T2 of the selected memory cell (e.g., memory cell 210, 212, or 214). Information to be stored in a selected memory cell of memory cell group $201_1$ during a write operation can be provided through a write path (described above) that includes data line 222 and transistor T2 of the selected memory cell (e.g., memory cell 211, 213, or 215). As described above, the value (e.g., binary value) of information stored in a particular memory cell among memory cells 210 through 215 can be based on the amount of charge in charge storage structure 202 of that particular memory cell.

In a write operation, the amount of charge in charge storage structure 202 of a selected memory cell can be changed (to reflect the value of information stored in the selected memory cell) by applying a voltage on a write path that includes transistor T2 of that particular memory cell and the data line (e.g., data line 221 or 222) coupled to that particular memory cell. For example, a voltage having one value (e.g., 0 V) can be applied on data line 221 (e.g., provide 0 V to signal BL1) if information to be stored in a selected memory cell among memory cells 210, 212, and 214 has one value (e.g., "0"). In another example, a voltage having another value (e.g., a positive voltage) can be applied on data line 221 (e.g., provide a positive voltage to signal BL1) if information to be stored in a selected memory cell among memory cells 210, 212, and 214 has another value (e.g., "1"). Thus, information can be stored (e.g., directly stored) in charge storage structure 202 of a particular memory cell by providing the information to be stored (e.g., in the form of a voltage) on a write path (that includes transistor T2) of that particular memory cell.

Figure 3:
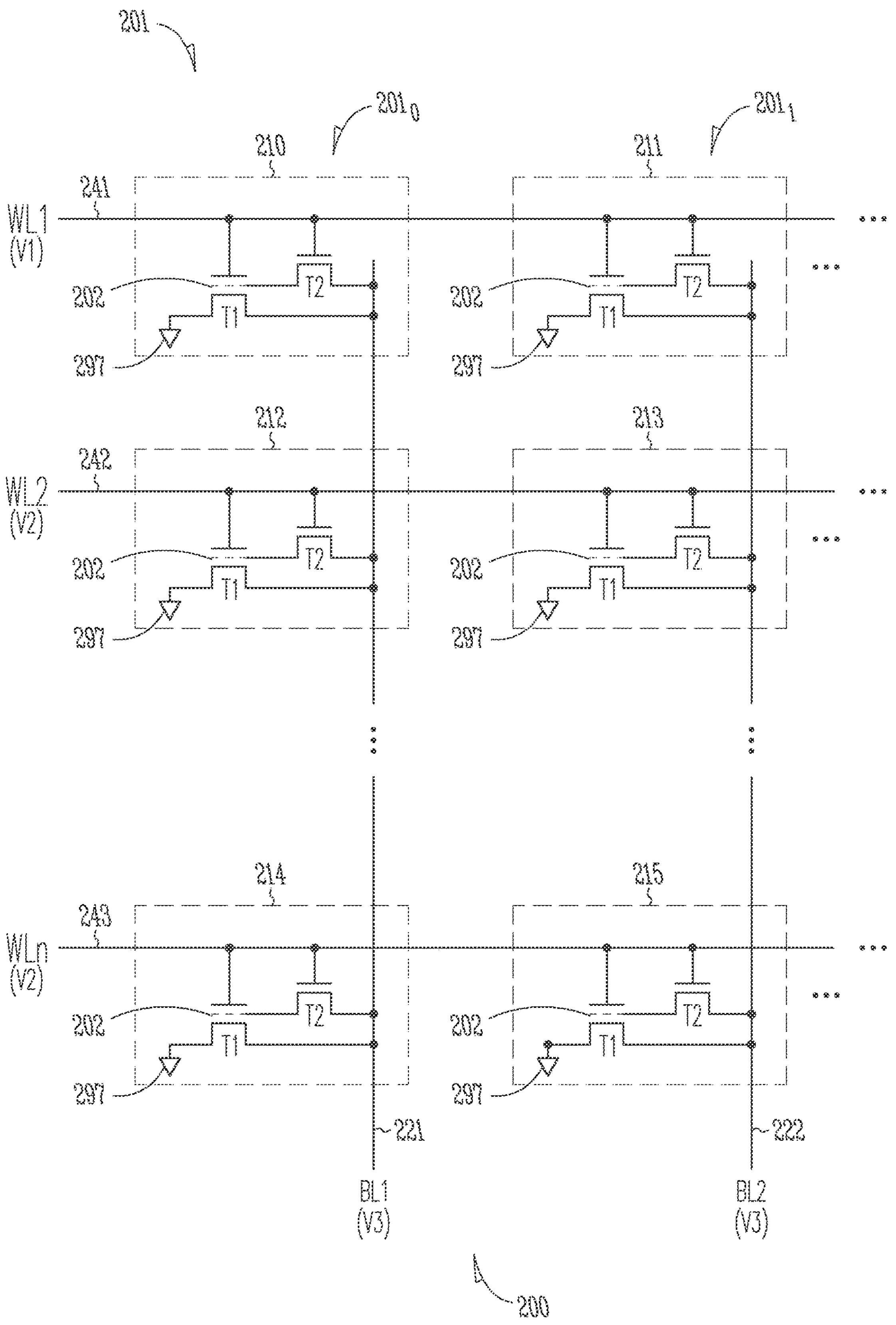
FIG. 3 shows the memory device of FIG. 2, including example voltages used during a read operation of the memory device, according to some embodiments described herein.

FIG. 3 shows memory device 200 of FIG. 2 including example voltages V1, V2, and V3 used during a read operation of memory device 200, according to some embodiments described herein. The example of FIG. 3 assumes that memory cells 210 and 211 are selected memory cells (e.g., target memory cells) during a read operation to read (e.g., to sense) information stored (e.g., previously stored) in memory cells 210 and 211. Memory cells 212 through 215 are assumed to be unselected memory cells. This means that memory cells 212 through 215 are not accessed, and information stored in memory cells 212 through 215 is not read while information is read from memory cells 210 and 211 in the example of FIG. 3.

In FIG. 3, voltages V1, V2, and V3 can represent different voltages applied to respective access lines 241, 242, and 243 and data lines 221 and 222 during a read operation of memory device 200. As an example, voltages V1, V2, and V3 can have values −1 V, 0 V, and 0.5V, respectively. The specific values of voltages used in this description are only example values. Different values may be used. For example, voltage V1 can have a negative value range (e.g., the value of voltage V1 can be from −3V to −1V).

In the read operation shown in FIG. 3, voltage V1 can have a value (voltage value) to turn on transistor T1 of each of memory cells 210 and 211 (selected memory cells in this example) and turn off (or keep off) transistor T2 of each of memory cells 210 and 211. This allows information to be read from memory cells 210 and 211. Voltage V2 can have a value, such that transistors T1 and T2 of each of memory cells 212 through 215 (unselected memory cells in this example) are turned off (e.g., kept off). Voltage V3 can have a value, such that a current (e.g., read current) may be formed on a read path that includes data line 221 and transistor T1 of memory cell 210, and a read path (a separate read path) that includes data line 222 and transistor T1 of memory cell 212. This allows a detection of current on the read paths coupled to memory cells 210 and 211, respectively. A detection circuitry (not shown) of memory device 200 can operate to translate the value of the detected current (during reading of information from the selected memory cells) into the value (e.g., "0", "1", or a combination of multi-bit values) of information read from the selected memory cell. In the example of FIG. 3, the value of the detected currents on data lines 221 and 222 can be translated into the values of information read from memory cells 210 and 211, respectively.

In the read operation shown in FIG. 3, the voltages applied to respective access lines 241, 242, and 243 can cause transistors T1 and T2 of each of memory cells 212 through 215, except transistor T1 of each of memory cells 210 and 211 (selected memory cells), to turn off (or to remain turned off). Transistor T1 of memory cell 210 (selected memory cell) may or may not turn on, depending on the value of the threshold voltage Vt1 of transistor T1 of memory cell 210. Transistor T1 of memory cell 211 (selected memory cell) may or may not turn on, depending on the value of the threshold voltage Vt1 of transistor T1 of memory cell 211. For example, if transistor T1 of each of memory cells (e.g., 210 through 215) of memory device 200 is configured (e.g., structured) such that the threshold voltage of transistor T1 is less than zero (e.g., Vt1<−1 V) regardless of the value (e.g., the state) of information stored in a respective memory cell 210, then transistor T1 of memory cell 210, in this example, can turn on and conduct a current on data line 221 (through transistor T1 of memory cell 210). In this example, transistor T1 of memory cell 211 can also turn on and conduct a current on data line 222 (through transistor T1 of memory cell 211). Memory device 200 can determine the value of information stored in memory cells 210 and 211 based on the value of the currents on data lines 221 and 222, respectively. As described above, memory device 200 can include detection circuitry to measure the value of currents on data lines 221 and 222 during a read operation.

Figure 4:
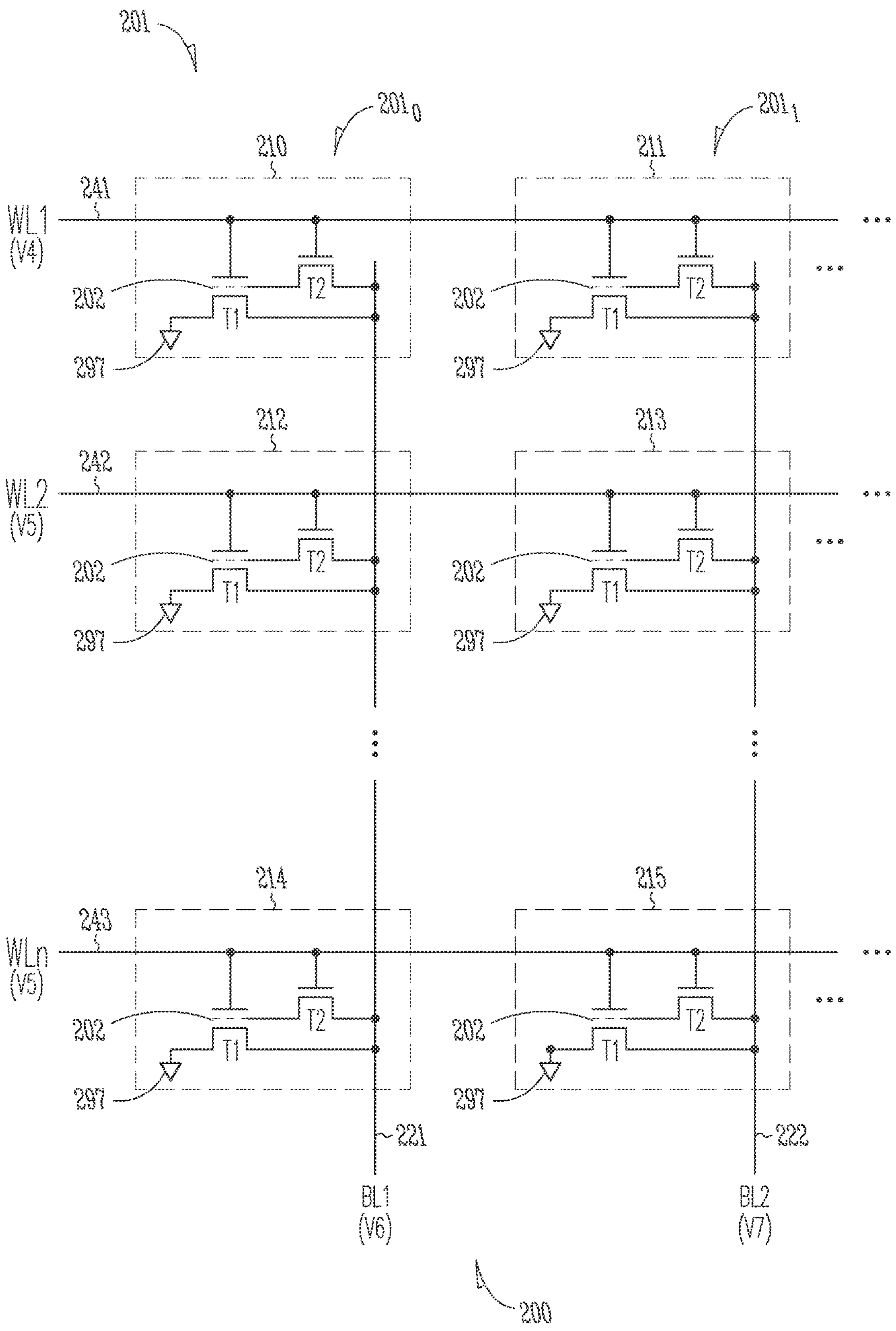
FIG. 4 shows the memory device of FIG. 2, including example voltages used during a write operation of the memory device, according to some embodiments described herein.

FIG. 4 shows memory device 200 of FIG. 2 including example voltages V4, V5, V6, and V7 used during a write operation of memory device 200, according to some embodiments described herein. The example of FIG. 4 assumes that memory cells 210 and 211 are selected memory cells (e.g., target memory cells) during a write operation to store information in memory cells 210 and 211. Memory cells 212 through 215 are assumed to be unselected memory cells. This means that memory cells 212 through 215 are not accessed and information is not to be stored in memory cells

212 through 215 while information is stored in memory cells 210 and 211 in the example of FIG. 4.

In FIG. 4, voltages V4, V5, V6, and V7 can represent different voltages applied to respective access lines 241, 242, and 243 and data lines 221 and 222 during a write operation of memory device 200. As an example, voltages V4 and V5 can have values of 3V and 0 V, respectively. These values are example values. Different values may be used.

The values of voltages V6 and V7 can be the same or different depending on the value (e.g., "0" or "1") of information to be stored in memory cells 210 and 211. For example, the values of voltages V6 and V7 can be the same (e.g., V6=V7) if the memory cells 210 and 211 are to store information having the same value. As an example, V6=V7=0 V if information to be stored in each memory cell 210 and 211 is "0", and V6=V7=1 V to 3V if information to be stored in each memory cell 210 and 211 is "1".

In another example, the values of voltages V6 and V7 can be different (e.g., V6 V7) if the memory cells 210 and 211 are to store information having different values. As an example, V6=0 V and V7=1 V to 3 V if "0" is to be stored in memory cell 210 and "1" is to be stored in memory cell 211. As another example, V6=1 V to 3 V and V7=0 V if "1" is to be stored in memory cell 210 and "0" is to be stored in memory cell 211.

The range of voltage of 1 V to 3 V is used here as an example. A different range of voltages can be used. Further, instead of applying 0 V (e.g., V6=0 V or V7=0 V) to a particular write data line (e.g., data line 221 or 222) for storing information having a value of "0" to the memory cell (e.g., memory cell 210 or 211) coupled to that particular write data line, a positive voltage (e.g., V6>0 V or V7>0 V) may be applied to that particular data line.

In a write operation of memory device 200 of FIG. 4, voltage V5 can have a value, such that transistors T1 and T2 of each of memory cells 212 through 215 (unselected memory cells, in this example) are turned off (e.g., kept off). Voltage V4 can have a value to turn on transistor T2 of each of memory cells 210 and 211 (selected memory cells in this example) and form a write path between charge storage structure 202 of memory cell 210 and data line 221, and a write path between charge storage structure 202 of memory cell 211 and data line 222. A current (e.g., write current) may be formed between charge storage structure 202 of memory cell 210 (selected memory cell) and data line 221. This current can affect (e.g., change) the amount of charge on charge storage structure 202 of memory cell 210 to reflect the value of information to be stored in memory cell 210. A current (e.g., another write current) may be formed between charge storage structure 202 of memory cell 211 (selected memory cell) and data line 222. This current can affect (e.g., change) the amount of charge on charge storage structure 202 of memory cell 211 to reflect the value of information to be stored in memory cell 211.

In the example write operation of FIG. 4, the value of voltage V6 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V7 in this example may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

Figure 6:
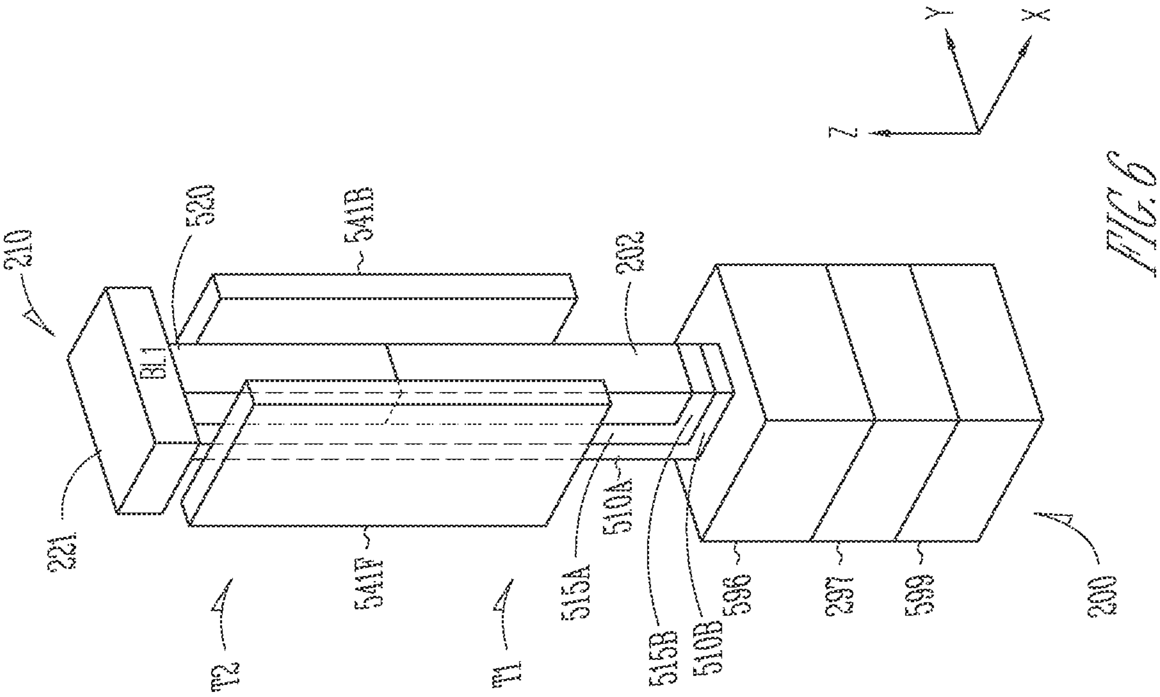
FIG. 5, FIG. 6, FIG. 7, and FIG. 8 show different views of a structure of the memory device of FIG. 2, according to some embodiments described herein.
Figure 5:
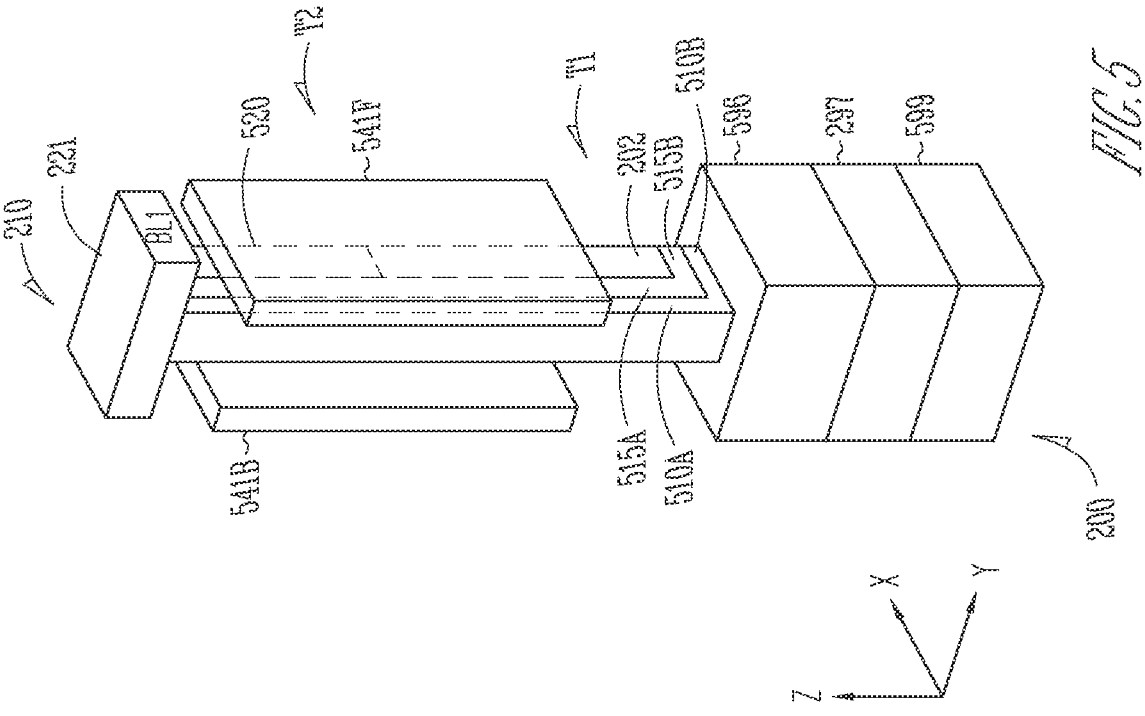
Figure 8:
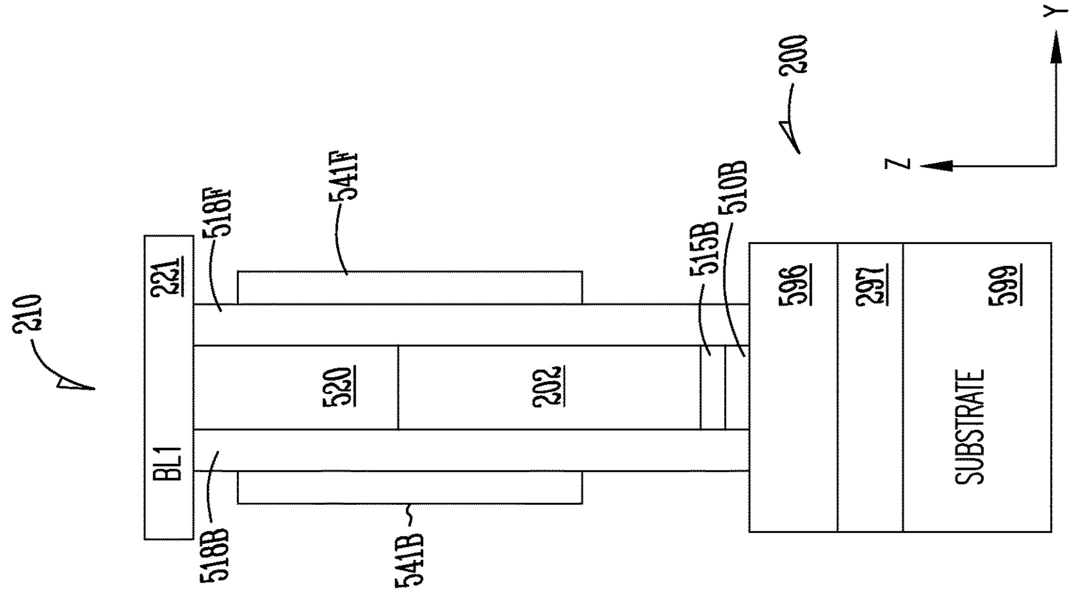
Figure 7:
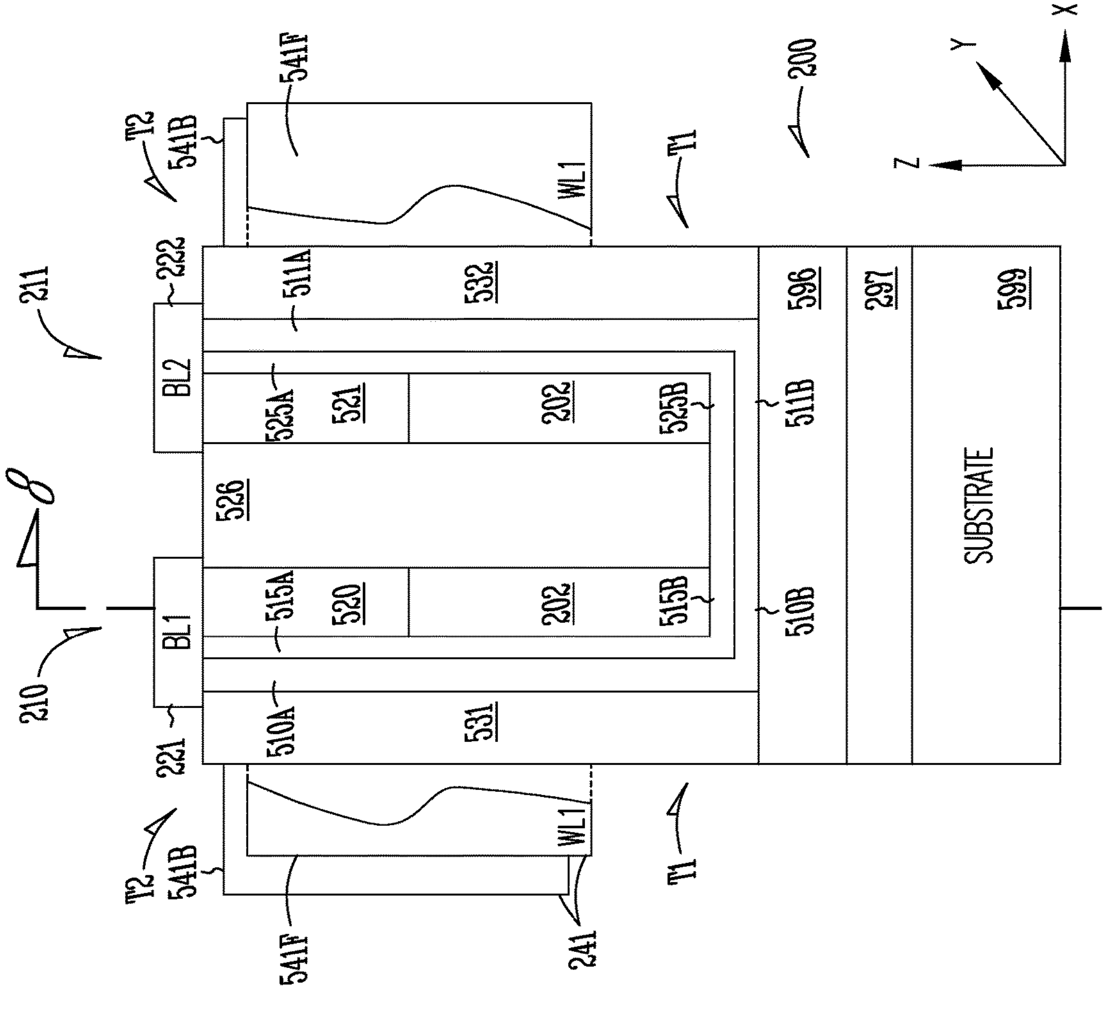

FIG. 5, FIG. 6, FIG. 7, and FIG. 8 show different views of a structure of memory device 200 of FIG. 2 with respect to the X, Y, and Z directions, according to some embodiments described herein. FIG. 5 and FIG. 6 show different 3-dimensional views (e.g., isometric views) of memory device 200 with respect to the X-Y, and Z directions. FIG. 7 shows a side view (e.g., cross-sectional view) of memory device 200 with respect to the X-Z direction. FIG. 8 shows a view (e.g., cross-sectional view) taken along lines 8-8 of FIG. 7.

For simplicity, FIG. 5 and FIG. 6 show the structure of memory cell 210. The structures of other memory cells (e.g., memory cells 211 through 215) of memory device 200 of FIG. 2 can be similar to or identical to the structure of memory cell 210 shown in FIG. 5 and FIG. 6. In FIG. 2 and FIG. 5 through FIG. 8, the same elements are given the same reference numbers.

The following description refers to FIG. 5 through FIG. 8. For simplicity, detailed description of the same element is not repeated in the description of FIG. 5 through FIG. 8. Also for simplicity, cross-sectional lines (e.g., hatch lines) are omitted from most of the elements shown in FIG. 5 through FIG. 8 and other figures (e.g., FIG. 9 through FIG. 29C) in the drawings described herein. Some elements of memory device 200 may be omitted from a particular figure of the drawings so as to not obscure the description of the element (or elements) being described in that particular figure. The dimensions (e.g., physical structures) of the elements shown in the drawings described herein are not scaled.

As shown in FIG. 5, memory device 200 can include a substrate 599 over which memory cell 210 (and other memory cells (not shown) of memory device 200) can be formed. Transistors T1 and T2 of memory cell 210 can be formed vertically with respect to substrate 599. Substrate 599 can be a semiconductor substrate (e.g., silicon-based substrate) or other type of substrate. The Z-direction (e.g., vertical direction) is a direction perpendicular to (e.g., outward from) substrate 599. The Z-direction is also perpendicular to (e.g., extended vertically from) an X-direction and a Y-direction. The X-direction and Y-direction are perpendicular to each other.

As shown in FIG. 5 through FIG. 8, ground connection 297 can include a structure (e.g., a piece (e.g., a layer)) of material located over substrate 599. Example materials for ground connection 297 include a piece of metal, conductively doped polysilicon, or other conductive materials. Ground connection 297 can be coupled to a ground terminal (not shown) of memory device 200.

FIG. 5 through FIG. 8 show ground connection 297 contacting (e.g., directly coupled to) substrate 599 as an example. In an alternative structure, memory device 200 can include a dielectric (e.g., a layer of dielectric material, not shown) between ground connection 297 and substrate 599.

As shown in FIG. 5 through FIG. 8, memory device 200 can include a semiconductor material 596 formed over ground connection 297. Semiconductor material 596 can include a structure (e.g., a piece (e.g., a layer)) of silicon, polysilicon, or other semiconductor material, and can include a doped region (e.g., p-type doped region).

Some portions (e.g., gate oxide and cell isolation structures) of memory device 200 are omitted from FIG. 5 and FIG. 6 so as to not obscure the structure of the elements being shown in FIG. 5 and FIG. 6.

As shown in FIG. 5 through FIG. 8, each of data lines 221 and 222 (associated with signals BL1 and BL2, respectively) can have a length in the Y-direction, a width in the X-direction, and a thickness in the Z-direction. Each of data lines 221 and 222 can include a conductive material (or a combination of materials) that can be structured as a conductive line (e.g., conductive region). Example materials for data lines 221 and 222 include metal, conductively doped polysilicon, or other conductive materials.

Access line 241 (associated with signal WL1) can be structured by (can include) a combination of portions 541F and 541B (e.g., front and back conductive portions with respect to the Y-direction). Each of portions 541F and 541B can include a conductive material (or a combination of materials) that can be structured as a conductive line (e.g., conductive region) having a length extending continuously in the X-direction. Thus, portions 541F and 541B can be part of conductive lines that are opposite from each other (e.g., opposite from each other in the Y-direction).

Each of portions 541F and 541B can include structure (e.g., a piece (e.g., a layer)) of conductive material (e.g., metal, conductively doped polysilicon, or other conductive materials). Each of portions 541F and 541B can have a length (shown in FIG. 5) in the X-direction, a width (shown in FIG. 5) in the Z-direction, and a thickness (shown in FIG. 8) in the Y-direction.

Portions 541F and 541B can be electrically coupled to each other. For example, memory device 200 can include a conductive material (e.g., not shown) that can contact (e.g., electrically couple to) portions 541F and 541B, such that portions 541F and 541B (which are part of a single access line 241) can be concurrently applied by the same signal (e.g., signal WL1).

In an alternative structure of memory device 200, either portion 541F or portion 541B can be omitted, such that access line 241 can include only either portion 541F or portion 541B. In the structure shown in FIG. 5, including two portions 541F and 541B can help better control transistor T1 (e.g., transistor T1, shown schematically in FIG. 2) of each of memory cells 210 and 211 during a read operation.

Charge storage structure 202 can include a charge storage material (or a combination of materials), which can include a piece (e.g., a layer) of semiconductor material (e.g., polysilicon), a piece (e.g., a layer) of metal, or a piece of material (or materials) that can trap charge. The materials for charge storage structure 202 and portions 541F and 541B of access line 241 can be the same or can be different. As shown in FIG. 5, charge storage structure 202 can include a portion (e.g., bottom portion) that is closer (e.g., extend in the Z-direction closer) to substrate 599 than each of portions 541F and 541B of access line 241.

FIG. 5 through FIG. 8 show an example where the top edge of charge storage structure 202 is at a specific distance (e.g., distance shown in FIG. 5) from the edge (e.g., bottom edge) of each of portions 541F and 541B of access line 241. However, the distance between the top edge of charge storage structure 202 and the edge (e.g., bottom edge) of each of portions 541F and 541B may vary.

FIG. 5 through FIG. 8 show an example where portions 541F and 541B overlap (in the Z-direction) charge storage structure 202. However, portions 541F and 541B may not overlap charge storage structure 202.

Memory device 200 can include material 520 located between data line 221 and charge storage structure 202. As shown in FIG. 5, material 520 can be electrically coupled to data line 221 and charge storage structure 202 of memory cell 210. As described above, charge storage structure 202 of memory cell 210 can form the memory element of memory cell 210. Thus, memory cell 210 can include a memory element (which is charge storage structure 202) located between substrate 599 and material 520 with respect to the Z-direction, and the memory element contacts (e.g., directly coupled to) material 520.

Material 520 can form a source (e.g., source terminal), a drain (e.g., drain terminal), a channel region (e.g., write channel region) between the source and the drain of transistor T2 of memory cell 210. Thus, as shown in FIG. 5, the source, channel region, and the drain of transistor T2 of memory cell 210 can be formed from a single piece of the same material (or alternatively, a single piece of the same combination of materials) such as material 520. Therefore, the source, the drain, and the channel region of transistor T2 of memory cell 210 can be formed from the same material (e.g., material 520) of the same conductivity type (e.g., either n-type or p-type).

As shown in FIG. 7, memory device 200 can include material 521 that can form a source (e.g., source terminal), a drain (e.g., drain terminal), and a channel region (e.g., write channel region) between the source and the drain of transistor T2 of memory cell 211. Thus, as shown in FIG. 5, the source, channel region, and the drain of transistor T2 of memory cell 211 can be formed from a single piece of the same material (or alternatively, a single piece of the same combination of materials) such as material 521.

Materials 520 and 521 can be the same. For example, each of materials 520 and 521 can include a structure (e.g., a piece (e.g., a layer)) of semiconductor material. In the example where transistor T2 is an NFET (as described above), materials 520 and 521 can include n-type semiconductor material (e.g., n-type silicon).

In another example, the semiconductor material that forms material 520 or material 521 can include a piece of oxide material. Examples of the oxide material used for materials 520 and 521 include semiconducting oxide materials, transparent conductive oxide materials, and other oxide materials.

As an example, each of materials 520 and 521 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the material listed above in memory device 200 provides improvement and benefits for memory device 200. For example, during a read operation, to read information from a selected memory cell (e.g., memory cell 210 or 211), charge from charge storage structure 202 of the selected memory cell may leak to transistor T2 of the selected memory cell. Using the material listed above for the channel region (e.g., material 520 or 521) of transistor T2 can reduce or prevent such a leakage. This improves the accuracy of information read from the selected memory cell and improves the retention of information stored in the memory cells of the memory device (e.g., memory device 200) described herein.

The materials listed above are examples of materials 520 and 521. However, other materials (e.g., a relatively high band-gap material) different from the above-listed materials can be used.

In FIG. 5, material 520 and charge storage structure 202 of memory cell 210 can be electrically coupled (e.g., directly coupled) to each other, such that material 520 can contact charge storage structure 202 of memory cell 210 without an intermediate material (e.g., without a conductive material) between charge storage structure 202 of memory cell 210 and material 520. In another example, material 520 can be electrically coupled to charge storage structure 202 of memory cell 210, such that material 520 is not directly coupled to (not contacting) charge storage structure 202 of memory cell 210, but material 520 is coupled to (e.g., indirectly contacting) charge storage structure 202 of memory cell 210 through an intermediate material (e.g., a conductive material, not shown in FIG. 5) between charge storage structure 202 of memory cell 210 and material 520.

As shown in FIG. 5, memory cell 210 can include portions 510A and 510B electrically coupled to each other. Each of portions 510A and 510B can include a structure (e.g., a piece (e.g., a layer)) of semiconductor material. Example materials for each of portions 510A and 510B include silicon, polysilicon (e.g., undoped or doped polysilicon), germanium, silicon-germanium, or other semiconductor materials, and semiconducting oxide materials (oxide semiconductors, e.g., SnO or other oxide semiconductors).

As described above with reference to FIG. 2, transistor T1 of memory cell 210 includes a channel region (e.g., read channel region). In FIG. 5, the channel region of transistor T1 of memory cell 210 can include (e.g., can be formed from a combination of) portions 510A and 510B. Portions 510A and 510B can be electrically coupled to data line 221. As described above with reference to FIG. 2, memory cell 210 can include a read path. In FIG. 5, portions 510A and 510B (e.g., the read channel region of transistor T1 of memory cell 210) can be part of the read path of memory cell 210 that can carry a current (e.g., read current) during a read operation of reading information from memory cell 210. For example, during a read operation, to read information from memory cell 210, portions 510A and 510B can conduct a current (e.g., read current) between data line 221 and ground connection 297 (through part of semiconductor material 596). The direction of the read current can be from data line 221 to ground connection 297 (through portions 510A, part of portion 510B, and part of semiconductor material 596). In the example where transistor T1 is a PFET and transistor T2 is an NFET, the material that forms portions 510A and 510B can have a different conductivity type from material 520 or 521. For example, portions 510A and 510B can include p-type semiconductor material (e.g., p-type silicon) regions, and materials 520 and 521 can include n-type semiconductor material (e.g., n-type gallium phosphide (GaP)) regions.

As shown in FIG. 5, FIG. 6, and FIG. 7, memory cell 210 can include dielectrics 515A and 515B. Dielectrics 515A and 515B can be gate oxide regions that electrically separate charge storage structure 202 from portions 510A and 510B, and electrically separate material 520 from portion 510A. Example materials for dielectrics 515A and 515B include silicon dioxide, hafnium oxide (e.g., $HfO_2$), aluminum oxide (e.g., $Al_2O_3$), or other dielectric materials. In an example structure of memory device 200, dielectrics 515A and 515B include a high-k dielectric material (e.g., a dielectric material having a dielectric constant greater than the dielectric constant of silicon dioxide). Using such a high-k dielectric material (instead of silicon dioxide) can improve the performance (e.g., reduce current leakage, increase drive capability of transistor T1, or both) of memory device 200.

As shown in FIG. 7, part of portion 541F can span across (e.g., overlap in the X-direction) part of portion 510A and part of material 520. As described above, portion 510A can form part of read channel region of transistor T1 and material 520 can form part of write channel region of transistor T2. Thus, as shown in FIG. 7, part of portion 541F can span across (e.g., overlap) part of (e.g., on a side (e.g., front side) in the Y-direction) both read and write channels of transistors T1 and T2, respectively. Although hidden from the view shown in FIG. 7 (but as can be seen in FIG. 5), part of portion 541B can span across (e.g., overlap in the X-direction) part of (e.g., on another side (e.g., back side opposite from the front side) in the Y-direction) portion 510A and a part of material 520. As shown in FIG. 7, access line 241 can also span across (e.g., overlap in the X-direction) part of portion 511A (e.g., a portion of the read channel region of transistor T1 of memory cell 211) and part of material 521 (e.g., a portion of write channel region of transistor T2 of memory cell 211).

The spanning (e.g., overlapping) of access line 241 across portion 510A and material 520 allows access line 241 (a single access line) to control (e.g., to turn on or turn off) both transistors T1 and T2 of memory cell 210 and both transistors of memory cell 211. Similarly, the spanning (e.g., overlapping) of access line 241 across portion 511A and material 521 allows access line 241 (a single access line) to control (e.g., turn on or turn off) both transistors T1 and T2 of memory cell 211.

As shown in FIG. 7, memory device 200 can include dielectric material 526 that can form a structure (e.g., a dielectric) to electrically separate (e.g., isolate) parts of two adjacent (in the X-direction) of memory cells of memory device 200. For example, dielectric material 526 can electrically separate material 520 (e.g., write channel region of transistor T2 of memory cell 210) from material 521 (e.g., write channel region of transistor T2 of memory cell 211) and electrically separate charge storage structure 202 of memory cell 210 from charge storage structure 202 of memory cell 211.

As shown in FIG. 7, memory device 200 can include a dielectric portion 531 and a dielectric portion 532 where memory cells 210 and 211 can be located between dielectric portions 531 and 532. Dielectric portion 531 can electrically isolate memory cell 210 from another memory cell (e.g., the memory cell on the left (not shown)) of memory cell 210. Dielectric portion 532 can electrically isolate memory cell 211 from another memory cell (e.g., the memory cell on the right (not shown) of memory cell 211). The area bounded by dielectric portions 531 and 532 and semiconductor material 596 can be part of a trench (not labeled) formed during a process of forming memory device 200. Thus, memory cells 210 and 211 can be formed in part of a trench.

Some of portions (e.g., materials) of memory cells 210 and 211 can be formed adjacent (e.g., formed on) respective side walls (e.g., vertical portion with respect to the Z-direction) of dielectric portions 531 and 532. For example, as shown in FIG. 7, portion 510A (e.g., semiconductor material portion) of memory cell 210 can be formed adjacent (e.g., formed on) a side wall (not labeled) of dielectric portion 531. In another example, as shown in FIG. 7, portion 511A (e.g., semiconductor material portion) of memory cell 210 can be formed adjacent (e.g., formed on) a side wall (not labeled) of dielectric portion 532.

As shown in FIG. 8, memory device 200 can include dielectrics 518F and 518B (e.g., oxide regions) to electrically separate portions 541F and 541B of access line 241 from other elements (e.g., from portions 510A and 511A (e.g., read channel regions), charge storage structure 202, and materials 520 and 521) of memory cells 210 and 211. The material (or materials) for dielectrics 518F and 518B can be the same as (or alternatively, different from) the material (or materials) of dielectrics 515A and 515B. Example materials for portions 518F and 518B can include silicon dioxide, hafnium oxide (e.g., $HfO_2$), aluminum oxide (e.g., $Al_2O_3$), or other dielectric materials.

As shown in FIG. 8, portions 541F and 541B can be adjacent respective sides of material 520 and charge storage structure 202 of memory cell 210. For example, portion 541F can be adjacent a side (e.g., right side in the X-direction in the view of FIG. 8) of a portion of each of material 520 and charge storage structure 202. In another example, portion 541B can be adjacent another side (e.g., left side (opposite from the right side) in the X-direction in the view of FIG. 8) of a portion of each of material 520 and charge storage structure 202.

The above description focuses on the structure of memory cell 210. Memory cell 211 can include elements structured in ways similar or identical to the elements of memory cell 210, described above. For example, as shown in FIG. 7, memory cell 211 can include charge storage structure 202, channel region (e.g., write channel region) 521, portions 511A and 511B (e.g., read channel region), and dielectrics 525A and 525B. The material (or materials) for dielectrics 525A and 525B can the same as the material (or materials) for dielectrics 515A and 515B.

As described above with reference to FIG. 2 through FIG. 8, the connection and structure of memory device 200 can allow a cross-point operation in that a memory cell (e.g. memory cell 210) of memory device 200 can be accessed using a single access line (e.g., access line 241) and a single data line (e.g., data line 221) during an operation (e.g., a read or write operation) of memory device 200. Such a cross-point operation can be achieved due in part to a terminal (e.g., a source terminal) of transistor T1 of each of the memory cells (e.g., memory cell 210 through 215) being coupled to a ground connection (e.g., ground connection 297). This ground connection allows a voltage level at a terminal (e.g., source terminal) of transistor T1 of a selected memory cell to remain unchanged (e.g., remain unswitched at 0 V), thereby allowing the cross-point operation. The cross-point operation and the structure of memory device 200 can provide better memory performance in comparison with some conventional volatile memory devices (e.g., DRAM devices).

FIG. 9 through FIG. 22 show different views of elements during processes of forming a memory device 900, according to some embodiments described herein. Some or all of the processes used to form memory device 900 can be used to form memory device 200 described above with reference to FIG. 2 through FIG. 8.

Figure 9:
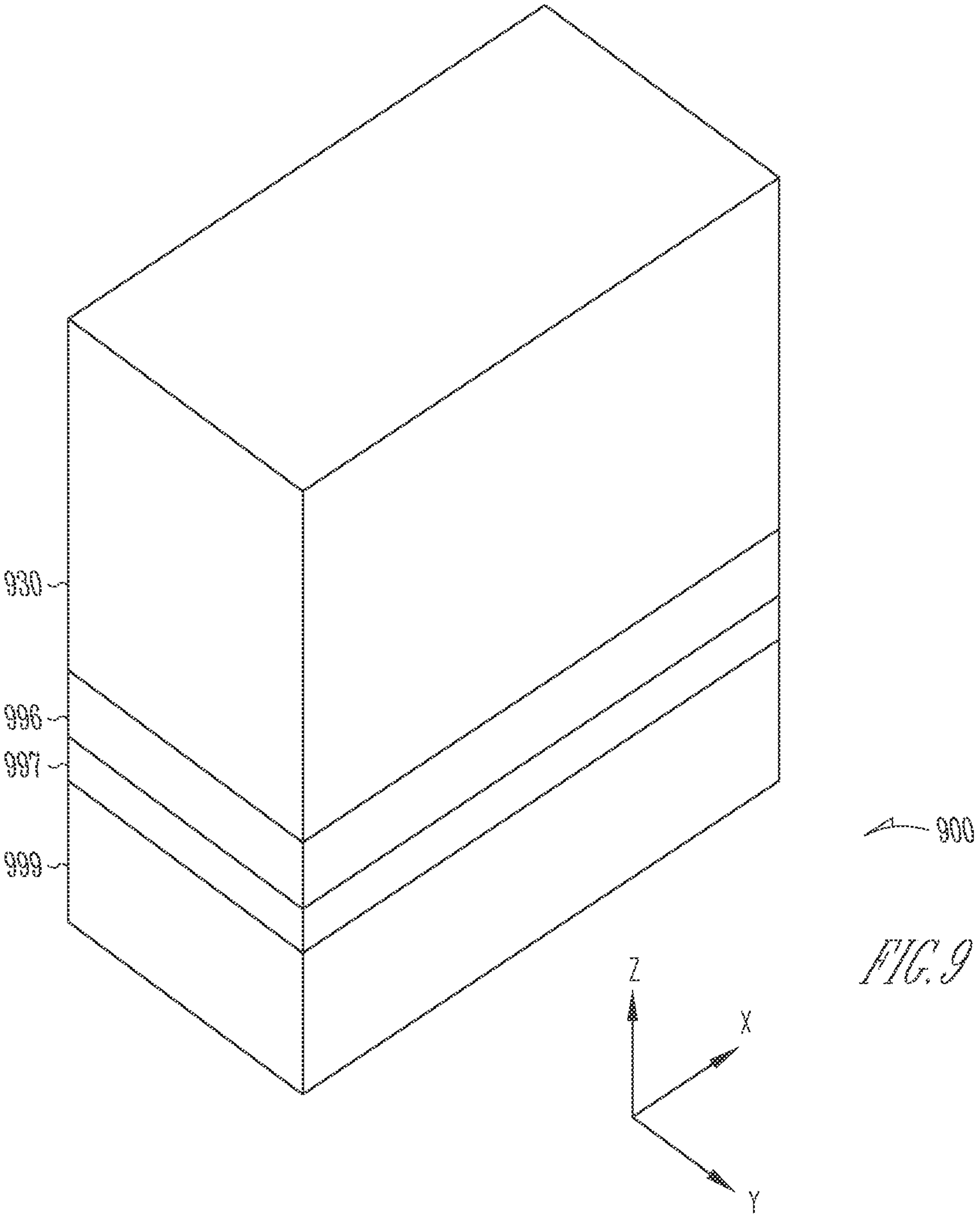
FIG. 9 through FIG. 22 show processes of forming a memory device, according to some embodiments described herein.

FIG. 9 shows memory device 900 after different levels (e.g., layers) of materials are formed in respective levels (e.g., layers) of memory device 900 in the Z-direction over a substrate 999. The different levels of materials include a dielectric material 930, a semiconductor material 996, and a conductive material 997. Dielectric material 930, semiconductor material 996, and conductive material 997 can be formed in a sequential fashion one material after another over substrate 999. For example, the processes used in FIG. 9 can include forming (e.g., depositing) conductive material 997 over substrate 999, forming (e.g., depositing) semiconductor material 996 over conductive material 997, and forming (e.g., depositing) dielectric material 930 over semiconductor material 996.

Substrate 999 can be similar to or identical to substrate 599 of FIG. Conductive material 997 can include a material (or materials) similar to or identical to that of the material for ground connection 297 of memory device 200 (FIG. 5 through FIG. 8). For example, conductive material 997 can include metal, conductively doped polysilicon, or other conductive materials.

Semiconductor material 996 includes a material (or materials) similar to or identical to that of the material for semiconductor material 596 of memory device 200 (FIG. 5 through FIG. 8). For example, semiconductor material 996 can include silicon, polysilicon, or other semiconductor material, and can include a doped region (e.g., p-type doped region). As described below in subsequent processes of forming memory device 900, semiconductor material 996 can be structured to form part of a channel region (e.g., read channel region) for a respective memory cell of memory device 900.

Dielectric materials 930 of FIG. 9 can include a nitride material (e.g., silicon nitride (e.g., $Si_3N_4$)), oxide material (e.g., $SiO_2$), or other dielectric materials. As described below in subsequent processes of forming memory device 900, dielectric material 930 can be processed into dielectric portions to form part of cell isolation structures to electrically isolate one memory cell from another memory cell of memory device 900.

Figure 10:
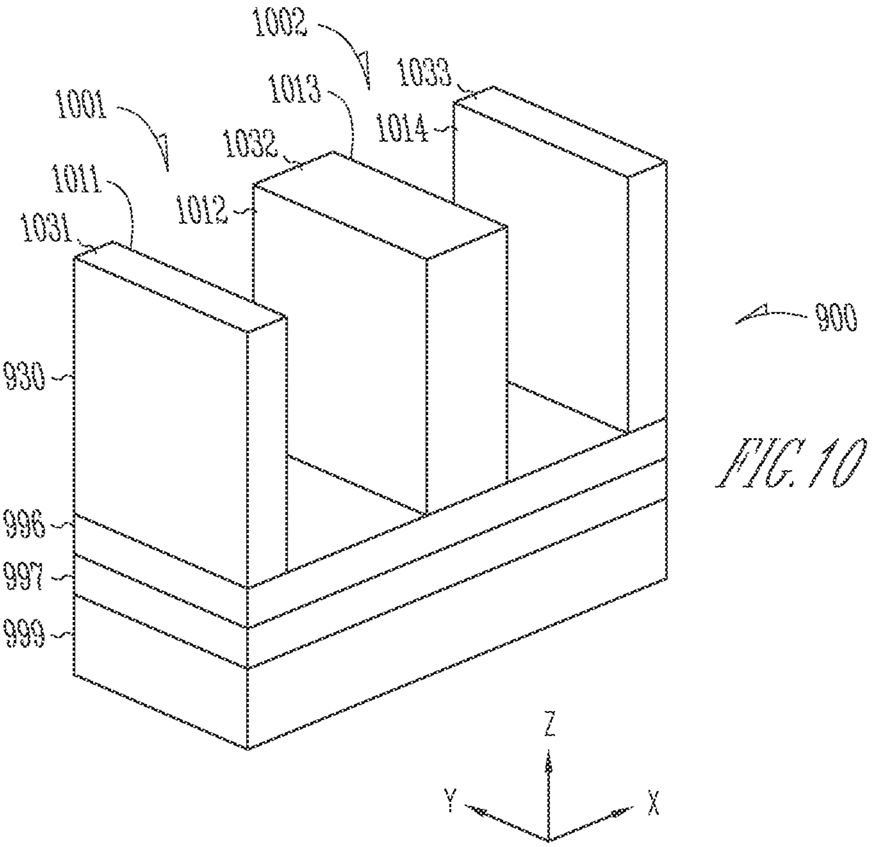

FIG. 10 shows memory device 900 after trenches (e.g., openings) 1001 and 1002 are formed. Forming trenches 1001 and 1002 can include removing (e.g., by patterning) part of dielectric material 930 (FIG. 9) at the locations of trenches 1001 and 1002 and leaving portions (e.g., dielectric portions) 1031, 1032, and 1033 (which are remaining portions of dielectric material 930) as shown in FIG.

Each of trenches 1001 and 1002 can have a length in the Y-direction, a width (shorter than the length) in the X-direction, and a bottom (not labeled) resting on (e.g., bounded by) a respective portion of semiconductor material 996. Each of trenches 1001 and 1002 can include opposing side walls (e.g., vertical side walls) formed by respective portions 1031, 1032, and 1033. For example, trench 1001 can include a side wall 1011 (formed by portion 1031) and a side wall 1012 (formed by portion 1032). Trench 1002 can include a side wall 1013 (formed by portion 1032) and a side wall 1014 (formed by portion 1033).

Figure 11:
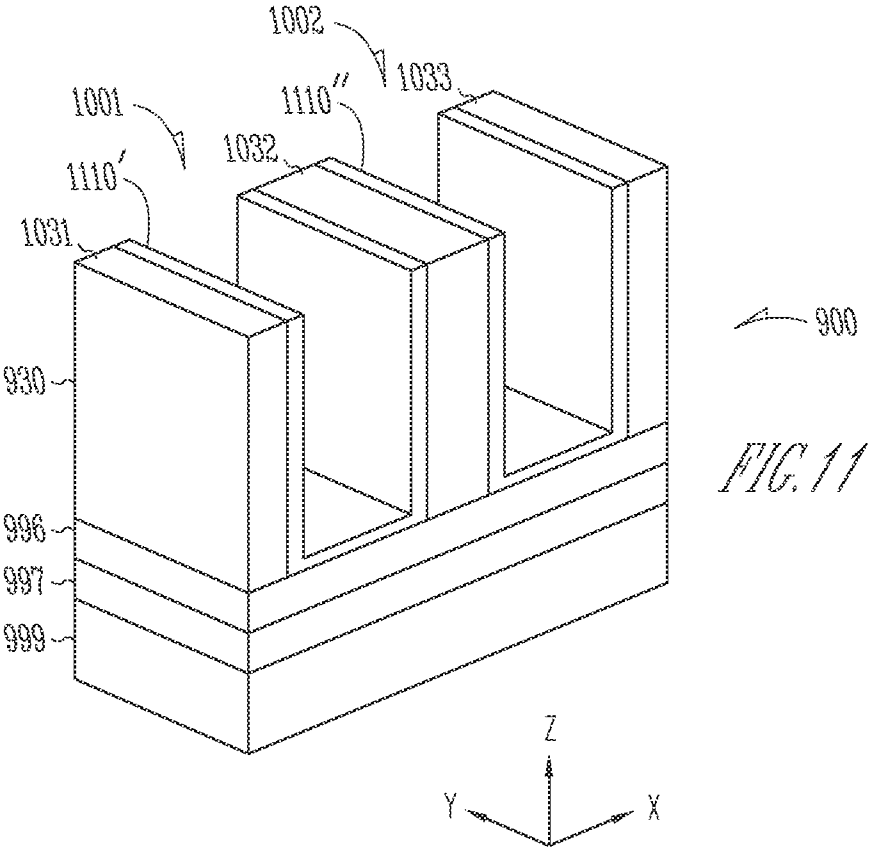

FIG. 11 shows memory device 900 after a material 1110' and a material 1110" are formed (e.g., deposited) in trenches 1001 and 1002, respectively. As shown in FIG. 11, material 1110' can be formed on side walls 1011 and 1012 and on the bottom (e.g., on a portion of semiconductor material 996) of trench 1001. Material 1110" can be formed on side walls 1013 and 1014 and on the bottom (e.g., on another portion of semiconductor material 996) of trench 1002.

Materials 1110' and 1110" can be the same material. An example of material 1110' a material 1110" includes a semiconductor material. Materials 1110' and 1110" can have the same properties as the materials that form portions 510A, 510B, 511A, and 511B (e.g., read channel regions) of transistors T1 of respective memory cells of memory device 200 of FIG. 5 through FIG. 8. As described below in subsequent processes (e.g., FIG. 19) of forming memory device 900, materials 1110' and 1110" can be structured to form channel regions (e.g., read channel regions) of transistors (e.g., transistors T1) of respective memory cells of memory device 900. Thus, each of materials 1110' and 1110" can conduct a current (e.g., conduct holes) during an operation (e.g., a read operation) of memory device 900.

The process of forming materials 1110' and 1110" can include a doping process. Such a doping process can include introducing dopants into materials 1110' and 1110" to allow a transistor (e.g., transistor T1) of a respective memory cell of memory device 900 to include a specific structure. For example, the doping process used in FIG. 9 can include introducing dopants (e.g., using a laser anneal process) with different dopant concentrations for different parts of materials 1110' and 1110", such that the transistor that includes material 1110' (or material 1110") can have a PFET structure. In such a PFET structure, part of material 1110' (or material 1110") can form a channel region (e.g., read channel region) to conduct currents (e.g., holes) during an operation (e.g., read operation) of memory device 900.

Figure 12:
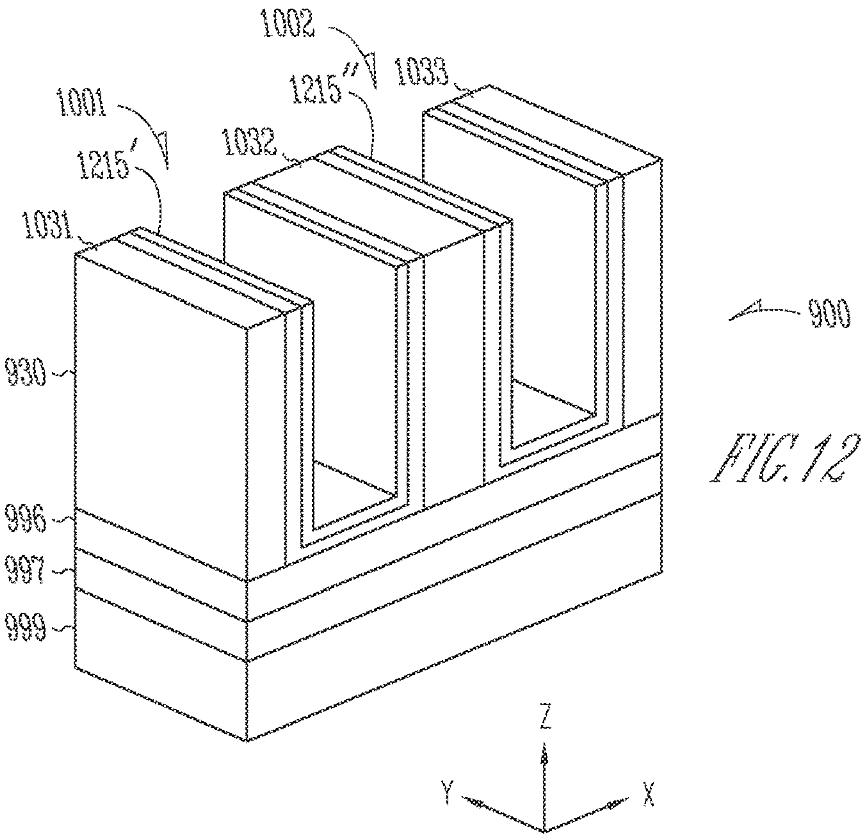

FIG. 12 shows memory device 900 after dielectric materials (e.g., oxide materials) 1215' and 1215" are formed (e.g., deposited) on materials 1110' and 1110", respectively. Dielectric materials 1215' and 1215" can be deposited, such that dielectric materials 1215' and 1215" can be conformal to materials 1110' and 1110", respectively. Materials 1215' and 1215" can have the same properties as the materials (e.g., oxide materials) that form dielectrics 515A, 515B, 525A, and 525B of memory device 200 of FIG. 5 through FIG. 8.

Figure 13:
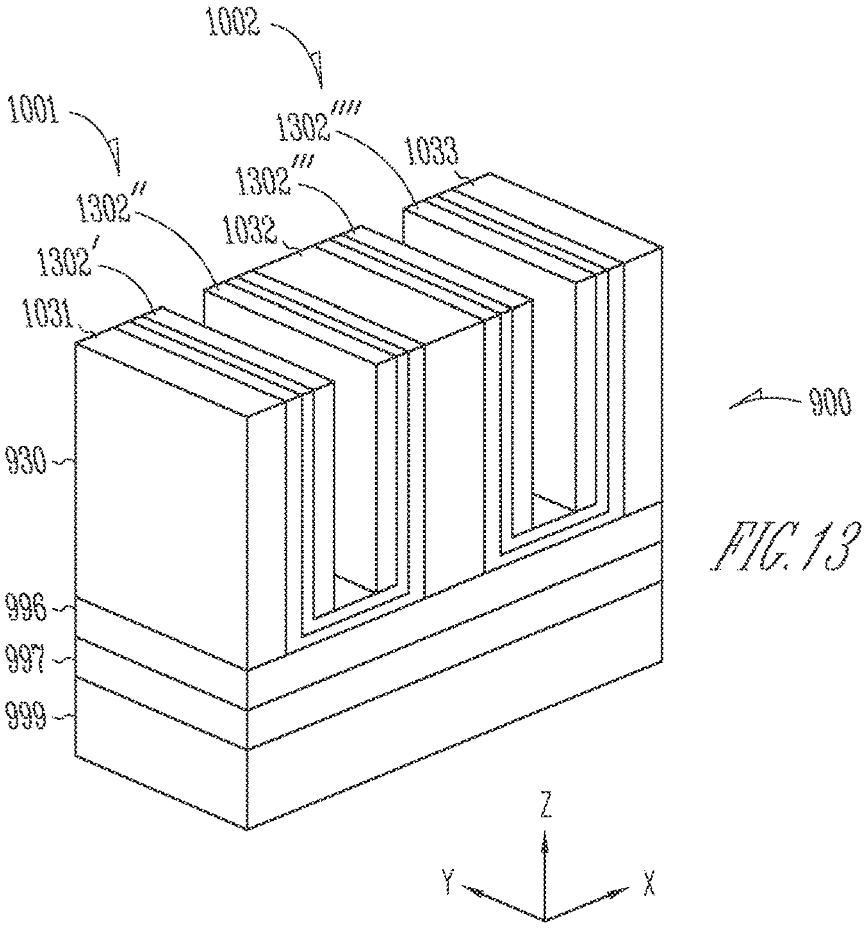

FIG. 13 shows memory device 900 after materials (e.g., charge storage materials) 1302', 1302", 1302'", and 1302"" are formed on respective side walls of materials 1215' and 1215". Materials 1302', 1302", 1302'", and 1302"" are electrically separated from each other. As described below in subsequent processes (FIG. 19) of forming memory device 900, each of materials 1302', 1302", 1302'", 1302"" can be structured to form a charge storage structure of a respective memory cell of memory device 900. Materials 1302', 1302", 1302'", 1302"" can include material (e.g., polysilicon) similar or identical to the material of charge storage structure 202 of the memory cells (e.g., memory cell 210 or 211) of memory device 200 (FIG. 5 through FIG. 8).

Figure 14:
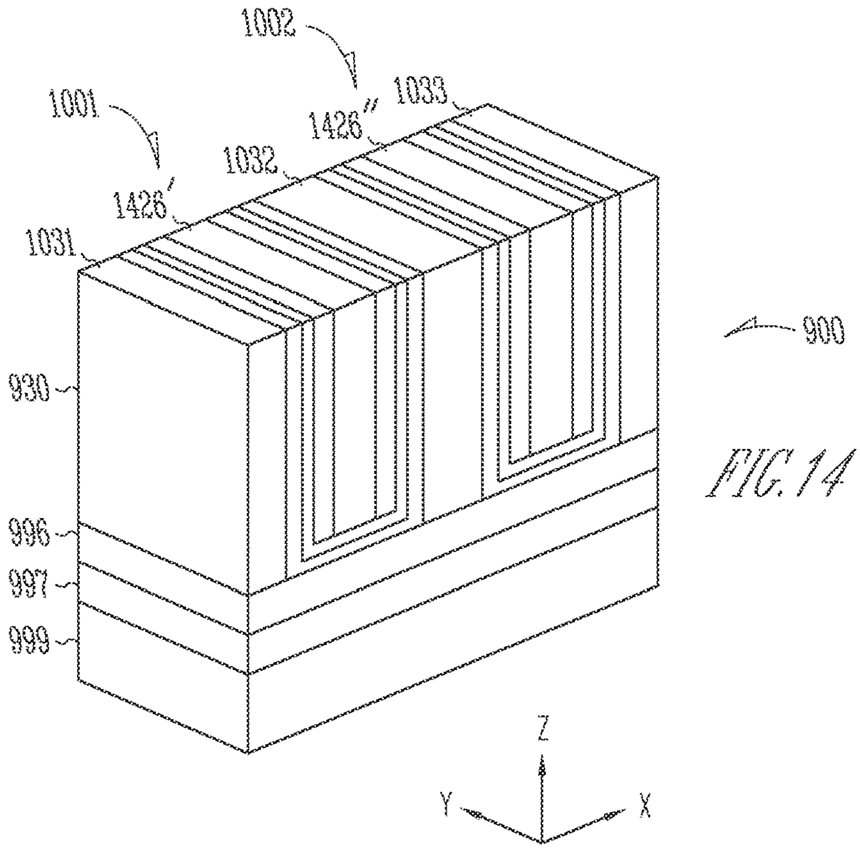

FIG. 14 shows memory device 900 after dielectric materials 1426' and 1426" are formed (e.g., filled) in opened spaces in trenches 1001 and 1002, respectively. Dielectric materials 1426' and 1426" can include an oxide material. As described below in subsequent processes of forming memory device 900, dielectric materials 1426' and 1426" can form part of an isolation structure that can electrically isolate parts of (e.g., charge storage structures) two adjacent (in the X-direction) memory cells of memory device 900.

Figure 15:
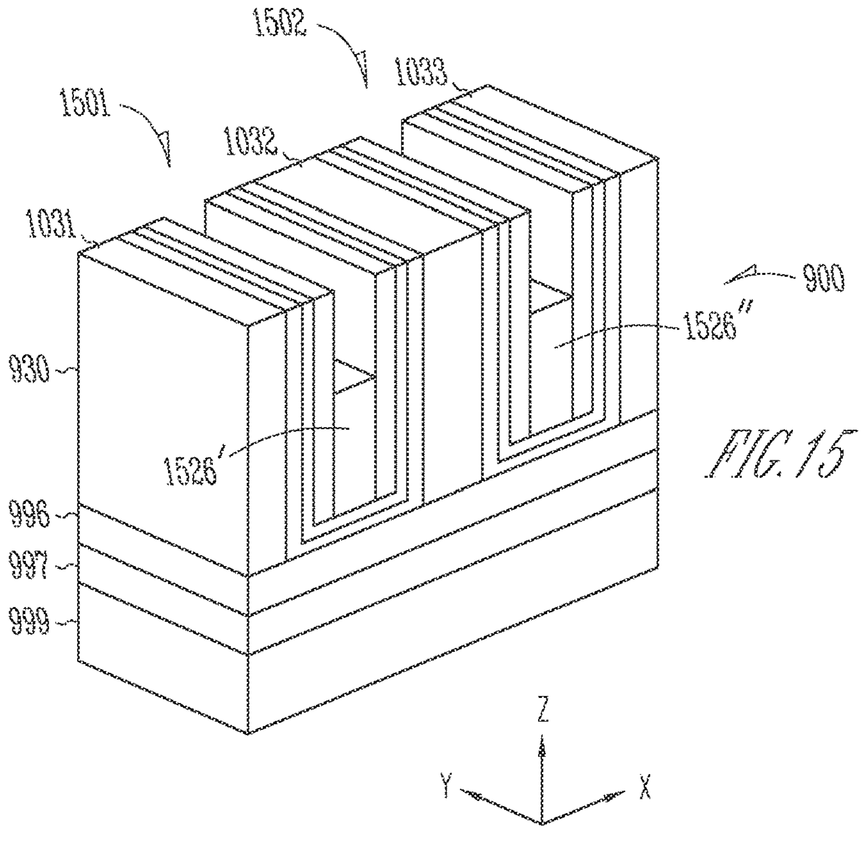

FIG. 15 shows memory device 900 after dielectric materials 1526' and 1526" are formed. Forming dielectric materials 1526' and 1526" can include removing (e.g., by using an etch process) part (e.g., top part) of each of dielectric materials 1426' and 1426" (FIG. 14), such that the remaining parts of dielectric materials 1426' and 1426" are dielectric materials 1526' and 1526" (FIG. 15), respectively.

Figure 16:
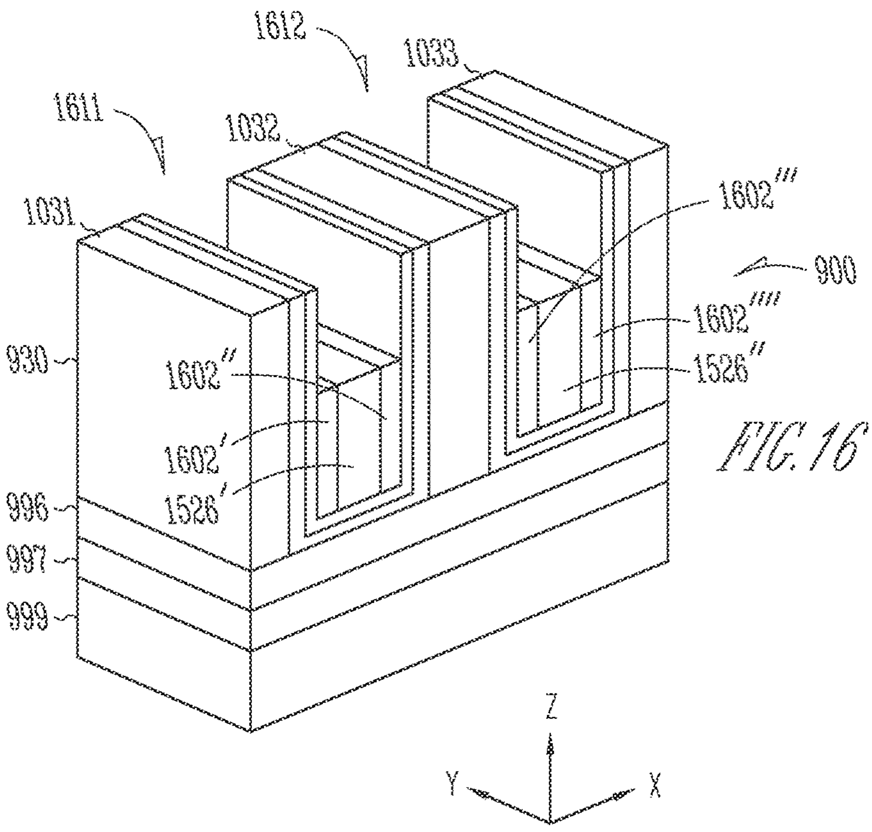

FIG. 16 shows memory device 900 after materials 1602', 1602", 1602'", and 1602"" are formed. Forming materials 1602', 1602", 1602', and 1602"" can include removing (e.g., by using an etch process) part (e.g., top part) of each of dielectric materials 1302', 1302", 1302', and 1302"" (FIG. 13), such that the remaining parts of materials 1302', 1302", 1302'", and 1302"" are materials 1602', 1602", 1602'", and 1602' (FIG. 16), respectively.

In FIG. 14, FIG. 15, and FIG. 16, part (e.g., top part) of dielectric materials 1426' and 1426" (FIG. 14) and part (e.g., top part) of materials 1302', 1302", 1302', 1302"" (FIG. 13) were removed in separate processes (e.g., multiple steps) as described with reference to FIG. 15 and FIG. 16. However, a single process (e.g., single step) can be used to remove part of dielectric materials 1426' and 1426" (FIG. 14) and part of materials 1302', 1302", 1302'", 1302"" (FIG. 13).

Figure 17:
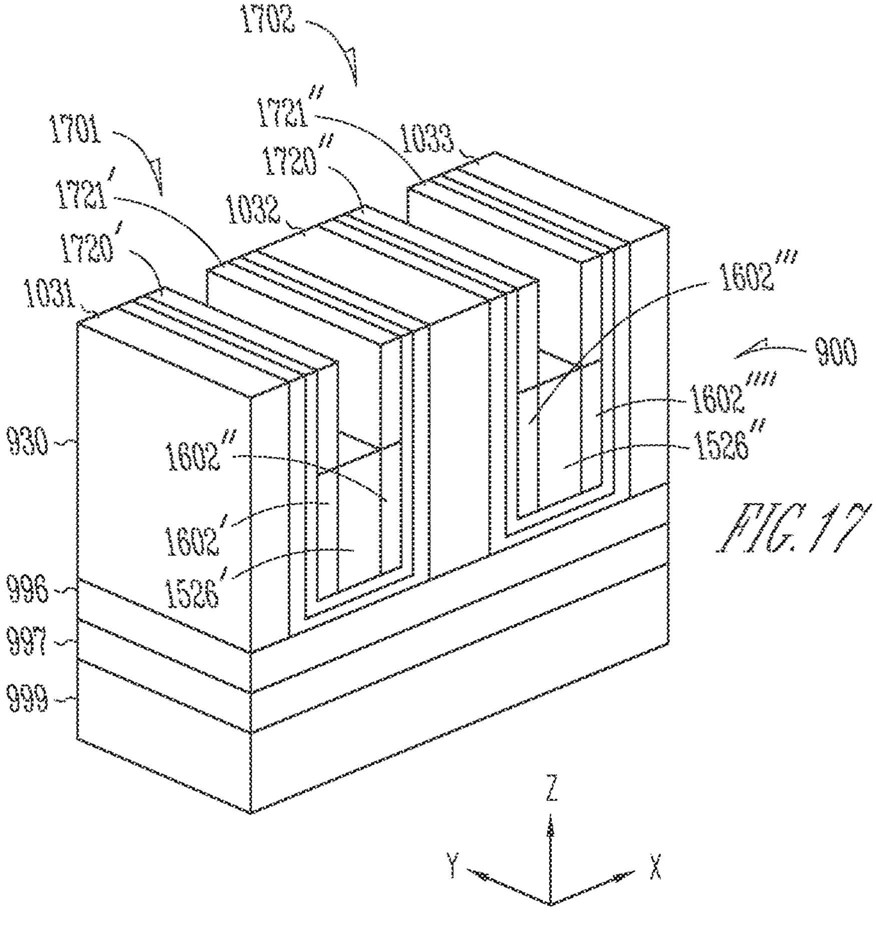

FIG. 17 shows memory device 900 after materials 1720', 1721', 1720", and 1721" are formed. Forming materials 1720', 1721', 1720", and 1721" can include depositing an initial material (or materials) on dielectric materials 1526' and 1526" and materials 1602', 1602", 1602'", and 1602'. Then, the process used in FIG. 17 can include removing (e.g., by using an etch process) a portion of the initial material at locations 1701 and 1702. Materials 1720', 1721', 1720", and 1721" are the remaining portions of the initial material. As shown in FIG. 17, materials 1720', 1721', 1720", and 1721" are electrically separated from each other. However, materials 1720', 1721', 1720", and 1721" are electrically coupled to (e.g., directly coupled to) materials 1602', 1602", 1602'", and 1602', respectively.

Materials 1720', 1721', 1720", and 1721" can include materials similar or identical to material (e.g., write channel region) 520 or 521 (FIG. 5) of transistor T2 of memory device 200 of FIG. 5 through FIG. 8. As described below in subsequent processes (FIG. 19) of forming memory device 900, each of materials 1720', 1721', 1720", and 1721" can form a channel region (e.g., write channel region) of a transistor (e.g., transistor T2) of a respective memory cell of memory device 900. Thus, each of materials 1720', 1721', 1720", and 1721" can conduct a current (e.g., conduct electrons) during an operation (e.g., a write operation) of memory device 900.

Figure 18:
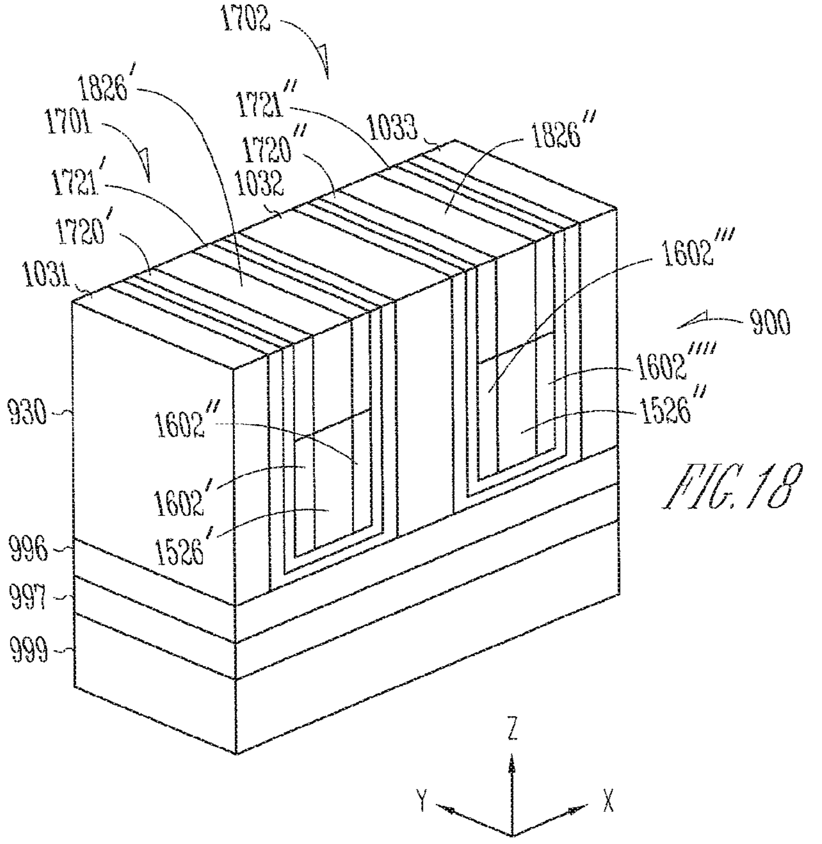

FIG. 18 shows memory device 900 after dielectric materials 1826' and 1826" are formed at (e.g., filled in) locations 1701 and 1702 (FIG. 17). Dielectric materials 1826' and 1826" can be the same as dielectric materials 1426' and 1426". As described below in subsequent processes of forming memory device 900, dielectric materials 1826' and 1826" can form part of an isolation structure that can electrically isolate parts of (e.g., write channel regions) two adjacent (in the X-direction) memory cells of memory device 900.

Figure 19:
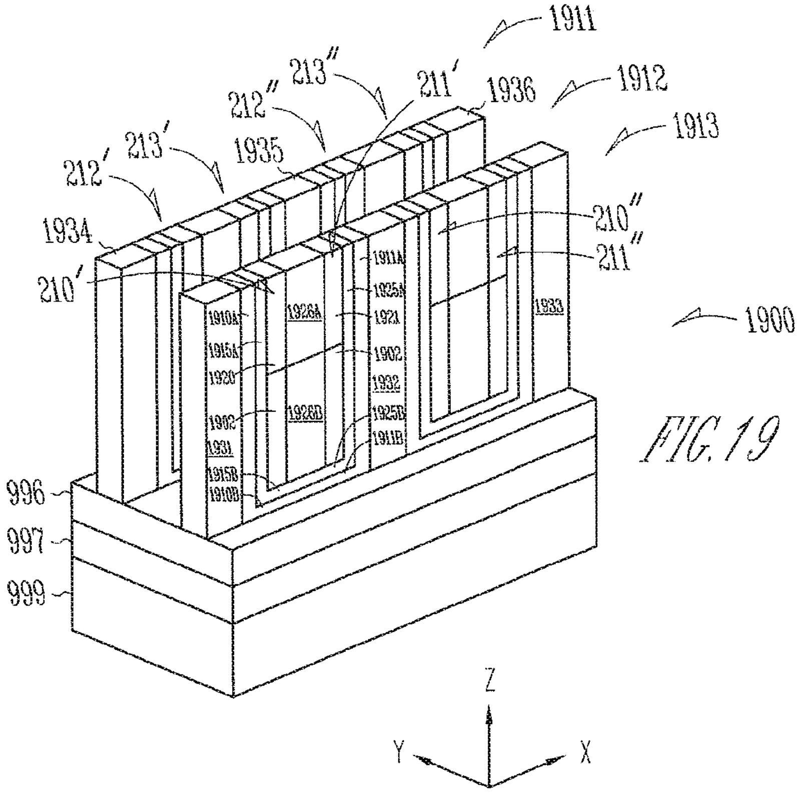

FIG. 19 shows memory device 900 after trenches 1911, 1912, and 1913 are formed (in the X-direction) across the materials of memory device 900. Each of trenches 1911, 1912, and 1913 can have a length in the X-direction, a width (shorter than the length) in the Y-direction, and a bottom (not labeled) resting on (e.g., bounded by) a respective portion of semiconductor material 996. Alternatively, each of trenches 1911, 1912, and 1913 can have a bottom (not labeled) resting on (e.g., bounded by) a respective portion of conductive material 997 (instead of semiconductor material 996). Forming trenches 1911, 1912, and 1913 can include removing (e.g., by cutting (e.g., etching) in the Z-direction) part of the materials of memory device 900 at locations of trenches 1911, 1912, and 1913 and leaving portions (e.g., slices) of the structure of memory device 900 shown in FIG. 19.

After portions (at the locations of trenches 1911, 1912, and 1913) of memory device 900 are removed (e.g., cut), the remaining portions can form parts of memory cells of memory device 900. For example, memory device 900 can include memory cells 210', 211', 210", and 211" in one row along the X-direction, and cells 212', 213', 212", and 213" in another row along the X-direction. Memory cells 210' and 211' can correspond to memory cells 210 and 211, respectively, of memory device 200 (FIG. 2 and FIG. 7). Memory cells 212' and 213' in FIG. 19 can correspond to memory cells 212 and 213, respectively, of memory device 200 (FIG. 2).

For simplicity, only some of similar elements (e.g., portions) of memory device 900 in FIG. 19 are labeled. For example, memory device 900 can include dielectric portions (e.g., cell isolation structures) 1931, 1932, 1933, 1934, 1935, and 1936, and dielectric materials 1926A and 1926B. Dielectric portions 1931 and 1932 can correspond to dielectric portions 531 and 532, respectively, of memory device 200 of FIG. 7.

As shown in FIG. 19, memory cell 210' can include portions 1910A and 1910B (which can be part of the read channel region of memory cell 210'), dielectrics 1915A and 1915B, material (e.g., write channel region) 1920, and charge storage structure 1902 (directly below material 1920). Memory cell 211' can include portions 1911A and 1911B (which can be part of the read channel region of memory cell 211'), dielectrics 1925A and 1925B, material (e.g., write channel region) 1921, and charge storage structure 1902 (directly below material 1921).

As described above with reference to FIG. 9 through FIG. 19, part of each of the memory cells of memory device 900 can be formed from a self-aligned process, which can include formation of trenches 1001 and 1002 in the Y-direction and trenches 1911, 1912, and 1913 in the X-direction. The self-aligned process can improve (e.g., increase) memory cell density, improve process (e.g., provide a higher process margin), or both. The self-aligned process, as described above, includes a reduced number of critical masks that can allow forming of multiple decks of memory cells in the same memory device. An example of a multi-deck memory device is described below with reference to FIG. 29A through FIG. 29C.

Figure 20:
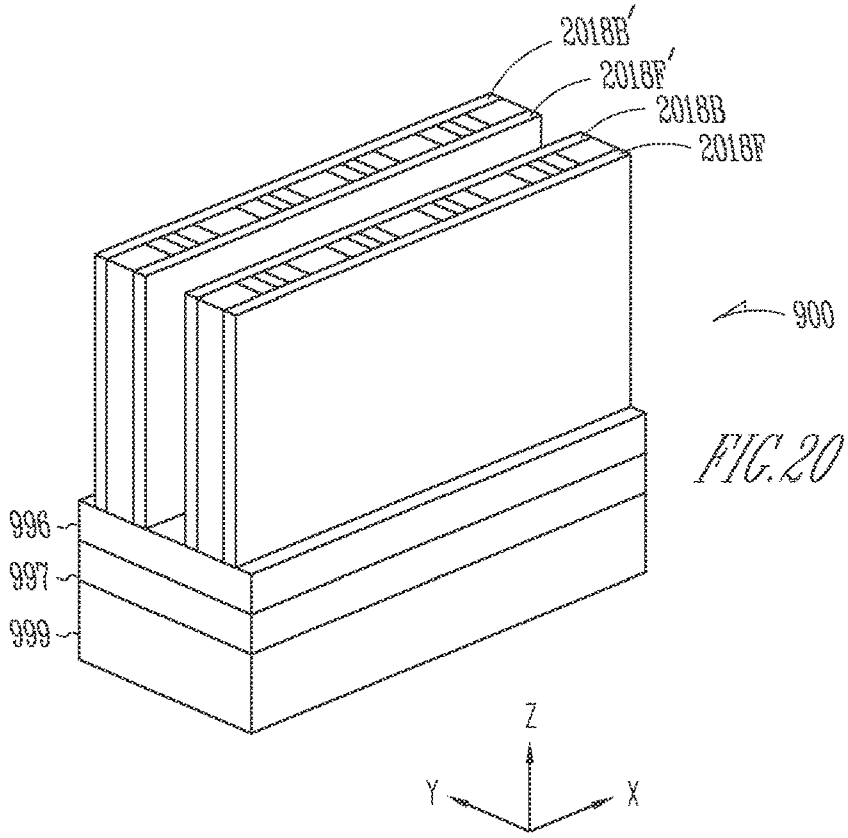

FIG. 20 shows memory device 900 after dielectrics 2018F, 2018B, 2018F', and 2018B' (e.g., oxide regions) are formed. The material (or materials) for dielectrics 2018F, 2018B, 2018F', and 2018B' can be the same as (or alternatively, different from) the material (or materials) of dielectrics 515A, 515B, 525A, and 525B. Example materials for dielectrics 2018F, 2018B, 2018F', and 2018B' can include silicon dioxide, hafnium oxide (e.g., $HfO_2$), aluminum oxide (e.g., $Al_2O_3$), or other dielectric materials.

Figure 21:
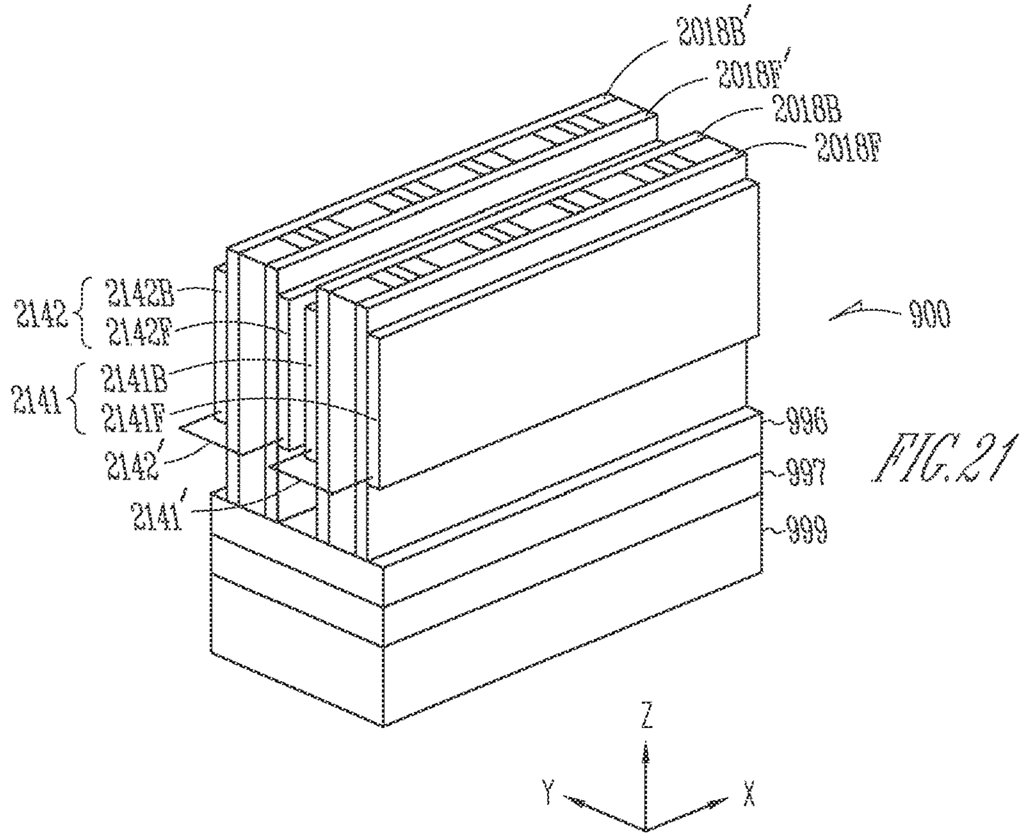

FIG. 21 shows memory device 900 after conductive lines (e.g., conductive regions) 2141F, 2141B, 2142F, and 2142B are formed. Each of conductive lines 2141F, 2141B, 2142F, and 2142B can include metal, conductively doped polysilicon, or other conductive materials. As shown in FIG. 21, conductive lines 2141F, 2141B, 2142F, and 2142B are electrically separated from other elements of memory device 900 by dielectrics 2018F, 2018B, 2018F', and 2018B', respectively.

Conductive lines 2141F and 2141B can form part of an access line (e.g., word line) 2141 to control the read and write transistors (e.g., transistor T1 and T2, respectively) of respective memory cells 210', 211', 210", and 211" of memory device 900. For example, conductive lines 2141F and 2141B can form front and back conductive portions, respectively, of access line 2141. Conductive lines 2142F and 2142B can form part of an access line (e.g., word line) 2142 to access memory cells 212', 213', 212", and 213" of memory device 900. For example, conductive lines 2142F and 2142B can form front and back conductive portions, respectively, of access line 2142. Access lines 2141 and 2412 can correspond to access lines 214 and 242, respectively, of memory device 200 of FIG. 2.

The processes of forming memory device 900 in FIG. 21 can include forming a conductive connection 2141' (which can include a conductive material (e.g., metal)) to electrically couple conductive lines 2141F and 2141B to each other. This allows conductive lines 2141F and 2141B to form part of or a single access line (e.g., access line 2141). Similarly, the processes of forming memory device 900 can include forming a conductive connection 2142' to electrically couple conductive lines 2142F and 2142B to each other. This allows conductive lines 2142F and 2142B to form part of a single access line (e.g., access line 2142).

Figure 22:
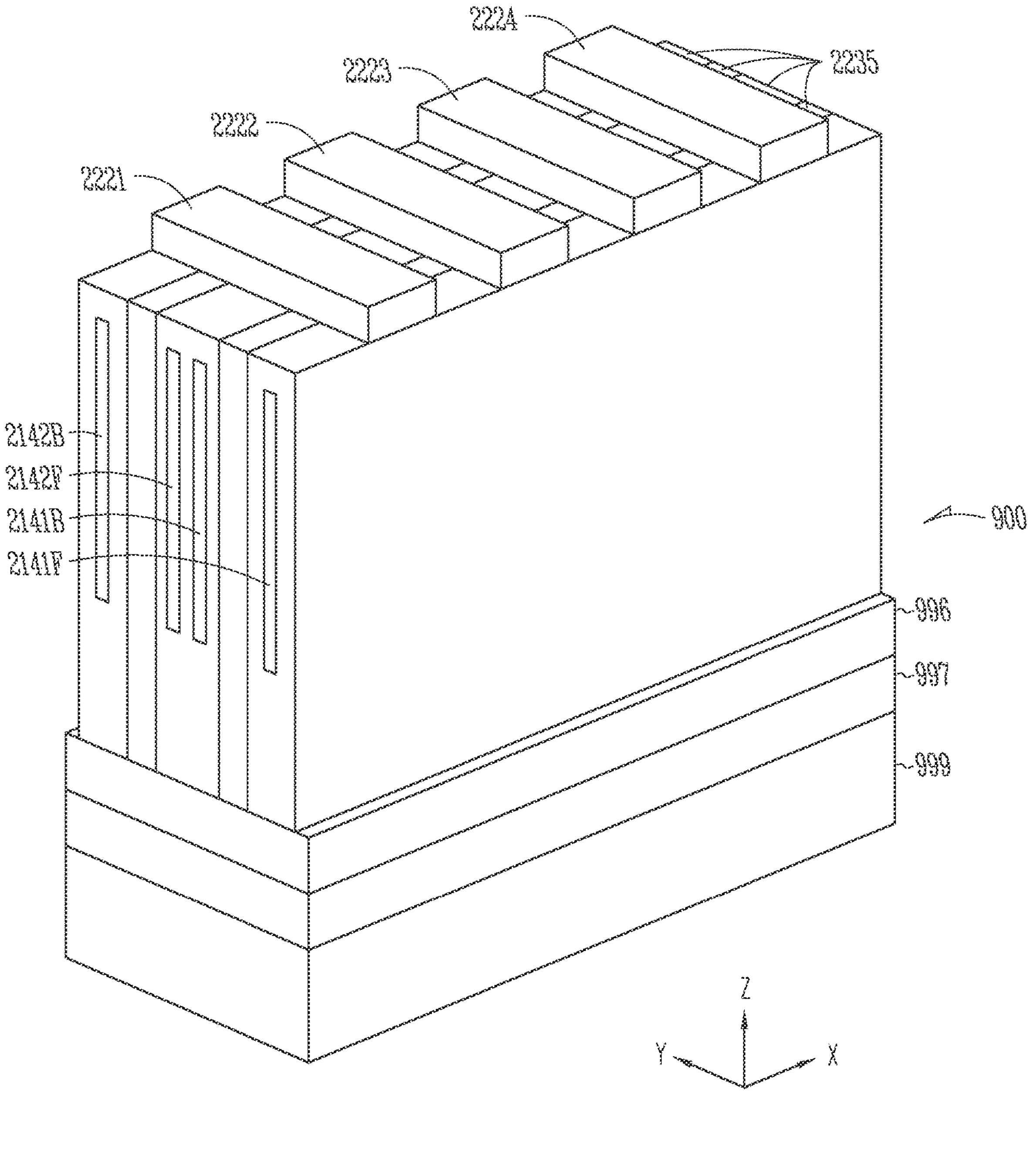

FIG. 22 shows memory device 900 after data lines 2221, 2222, 2223, and 2224 are formed. Each of data lines 2221, 2222, 2223, and 2224 can have a length in the Y-direction, a width in the X-direction, and a thickness in the Z-direction. Data lines 2221 and 2222 can correspond to data lines 221 and 222, respectively, of memory device 200 (FIG. 2 and FIG. 7).

In FIG. 22, data lines 2221, 2222, 2223, and 2224 can be electrically coupled to (e.g., contact) a respective portion of each of the memory cells in the Y-direction of memory device 900. For example, data line 2221 can be electrically coupled to portion 1910A (part of a read channel region of memory cell 210') and material 1920 (part of a write channel region of memory cell 210'). Data line 2221 can be also be electrically coupled to a read channel region (not labeled) of memory cell 212' and write channel region (not labeled) of memory cell 212'.

The description of forming memory device 900 with reference to FIG. 9 through FIG. 22 can include other processes to form a complete memory device. Such processes are omitted from the above description so as to not obscure the subject matter described herein.

The process of forming memory device 900 as described above can have a relatively reduced number of masks (e.g., reduced number of critical masks) in comparison with some conventional processes. For example, by forming trenches 1001 and 1002 in the process associated with FIG. 10, and forming trenches 1911, 1912, and 1913 in the process of FIG. 19, the number of critical masks used to form the memory cells of memory device 900 can be reduced. The reduced number of masks can simplify the process, reduce cost, or both, of forming memory device 900.

FIG. 23 through FIG. 28 show processes of forming a memory device 2300 including a shielding structure between adjacent memory cells, according to some embodiments described herein. The processes of forming memory device 2300 can be a variation of the processes of forming memory device 900 (FIG. 9 through FIG. 22). Thus, similar elements (which have the same labels) between the processes of forming memory devices 900 and 2300 are not repeated.

Figure 23:
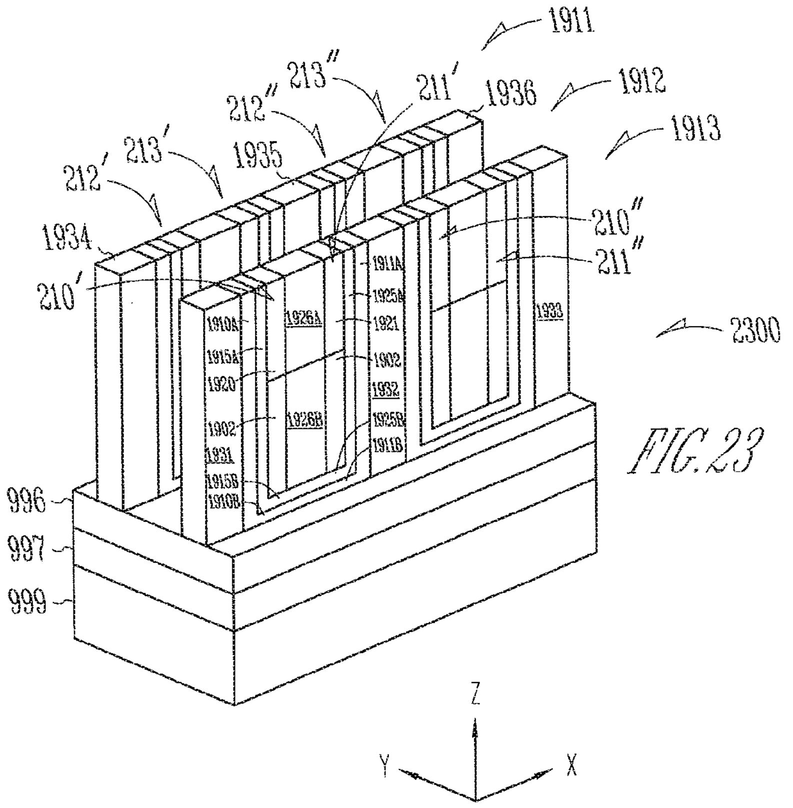
FIG. 23 through FIG. 28 show processes of forming a memory device including a shielding structure between adjacent memory cells, according to some embodiments described herein.

FIG. 23 shows the elements of memory device 2300 that can be formed using similar or identical processes used to form the elements of memory device 900 of FIG. 9 through FIG. 19. Thus, the elements of memory device 2300 shown in FIG. 23 can be similar to the elements of memory device 900 shown in FIG. 19.

Figure 24:
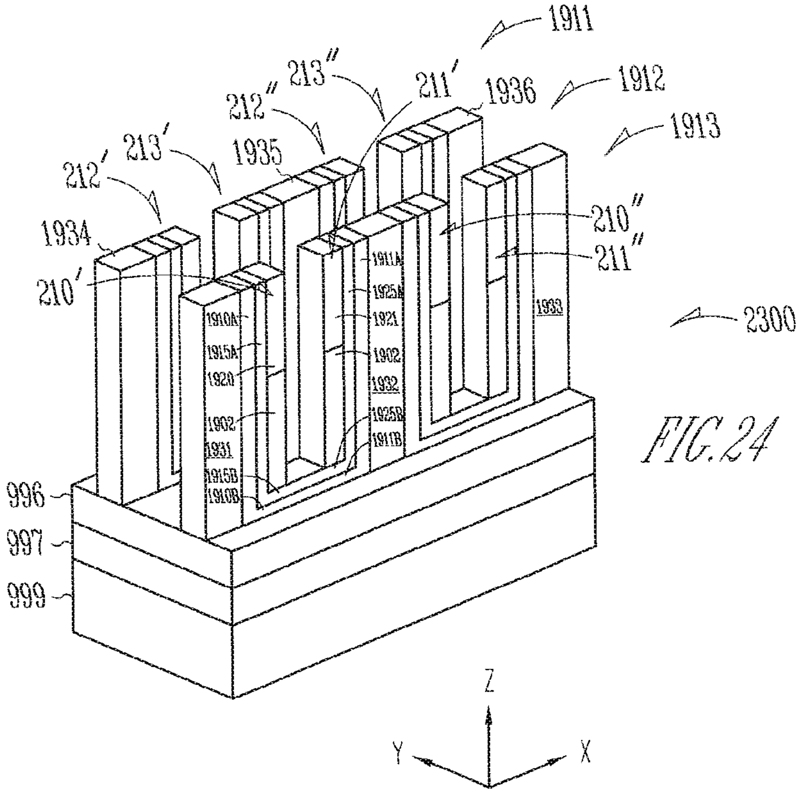

FIG. 24 shows memory device 2300 after the removal of dielectric materials 1926A and 1926B between materials (e.g., write channel regions) 1920 and 1921 and between charge storage structures 1902 of memory cells 210' and 211'. The process of FIG. 24 also removes other similar of dielectric materials between write channel regions and between charge storage structures of other memory cells of memory device 2300.

Figure 25:
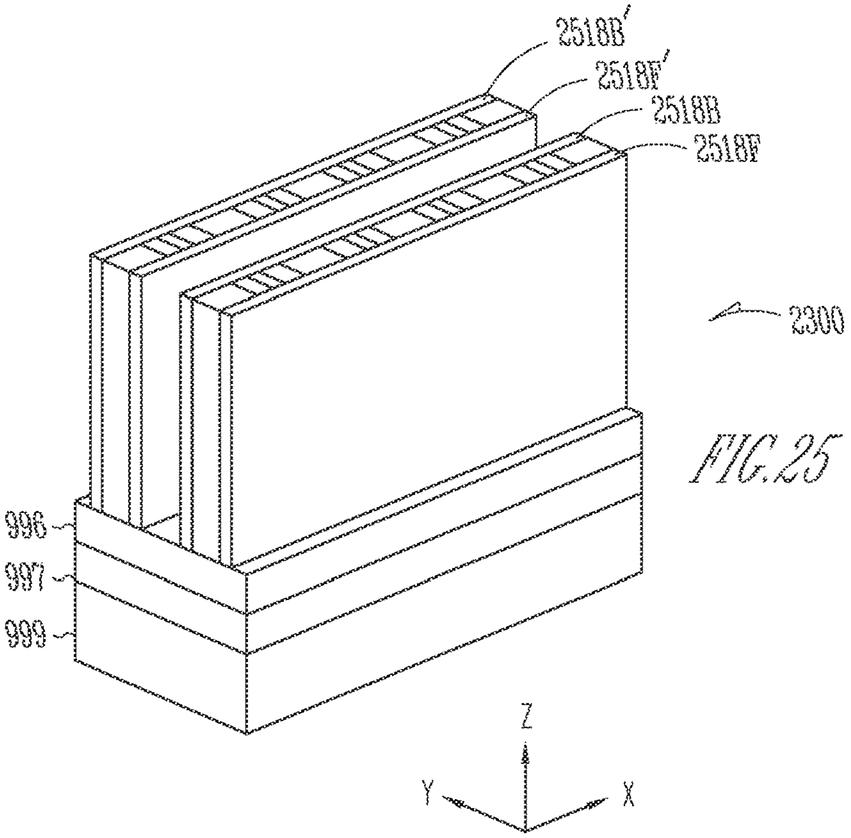

FIG. 25 shows memory device 2300 after dielectrics 2518F, 2518B, 2518F', and 2518B' (e.g., oxide regions) are formed. The material (or materials) for dielectrics 2518F, 2518B, 2518F', and 2518B' can be the same as the material (or materials) of dielectrics 2018F, 2018B, 2018F', and 2018B' (FIG. 20). Example materials for dielectrics 2518F, 2518B, 2518F', and 2518B' can include silicon dioxide, hafnium oxide (e.g., $HfO_2$), aluminum oxide (e.g., $Al_2O_3$), or other dielectric materials.

Figure 26:
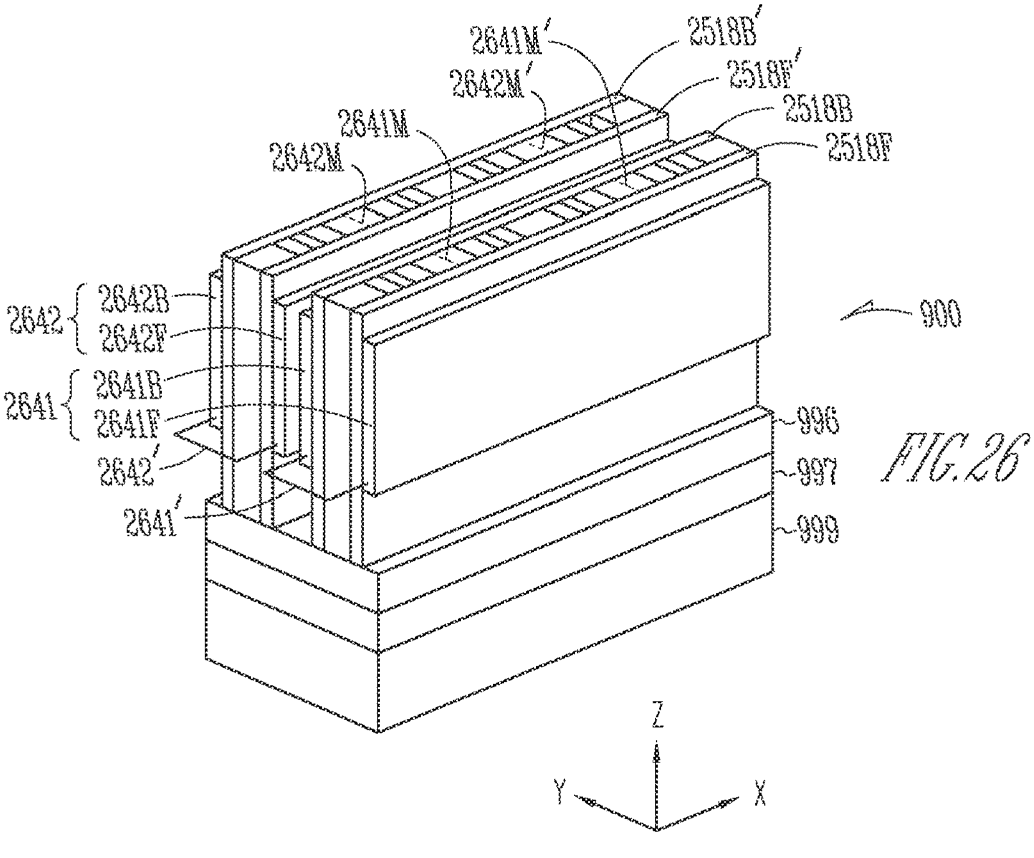

FIG. 26 shows memory device 2300 after conductive lines (e.g., conductive regions) 2641F, 2641B, 2642F, and 2642B and conductive portions 2641M and 2642M are formed (e.g., deposited). Conductive lines 2641F, 2641B, 2642F, and 2642B and conductive portions 2641M and 2642M can be formed from the same material in the same process (e.g., same step). For example, a material can be deposited at the same time (e.g., in the same step) to form conductive lines 2641F, 2641B, 2642F, and 2642B and conductive portions 2641M and 2642M. Example materials for conductive lines 2641F, 2641B, 2642F, and 2642B and conductive portions 2641M and 2642M include metal, conductively doped polysilicon, or other conductive materials. As shown in FIG. 26, conductive lines 2641F, 2641B, 2642F, and 2642B and conductive portions 2641M and 2642M are electrically separated from other elements of memory device 2300 by dielectrics 2018F, 2018B, 2018F', and 2018B', respectively.

Conductive lines 2641F and 2641B and conductive portion 2641M can form part of an access line (e.g., word line) 2641 to access memory cells 210', 211', 210'', and 211'' of memory device 2300. For example, conductive lines 2641F and 2641B can form front and back conductive portions, respectively, of access line 2641. Conductive lines 2642F and 2642B and conductive portion 2642M can form part of an access line (e.g., word line) 2642 to access memory cells 212', 213', 212'', and 213'' of memory device 2300. For example, conductive lines 2642F and 2642B can form front and back conductive portions, respectively, of access line 2642. Access lines 2641 and 2612 can correspond to access lines 241 and 242, respectively, of memory device 200 of FIG. 2.

The processes of forming memory device 900 in FIG. 26 can include forming a conductive connection 2641' (which can include a conductive material (e.g., metal)) to electrically couple conductive lines 2641F and 2641B to each other. Similarly, the processes of forming memory device 900 can include forming a conductive connection 2642' to electrically couple conductive lines 2642F and 2642B to each other.

Figure 27:
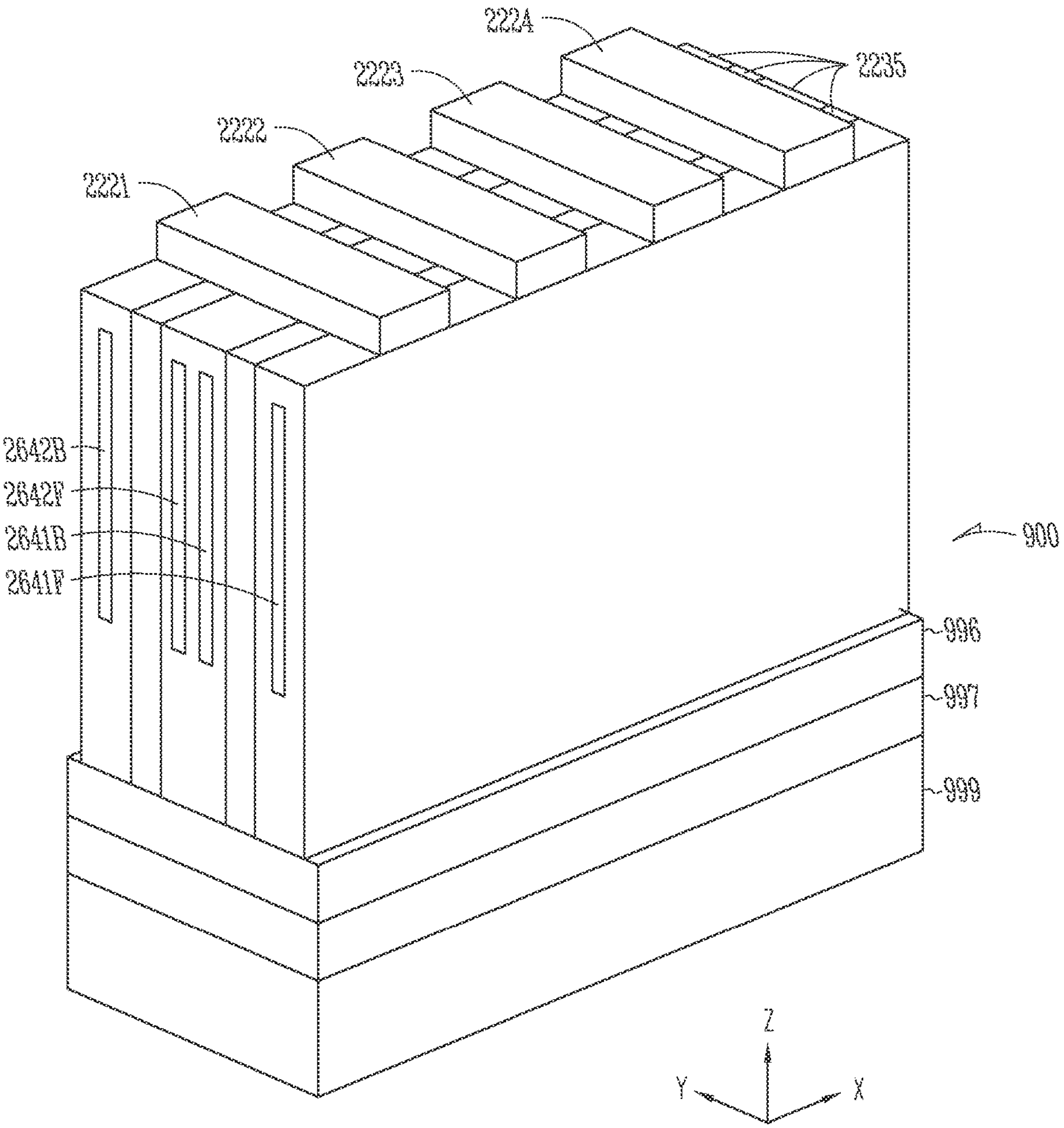

FIG. 27 shows memory device 2300 after data lines 2221, 2222, 2223, and 2224 are formed. Each of data lines 2221, 2222, 2223, and 2224 can have a length in the Y-direction, a width in the X-direction, and a thickness in the Z-direction. Data lines 2221 and 2222 can correspond to data lines 221 and 222, respectively, of memory device 200 (FIG. 2 and FIG. 7).

Figure 28:
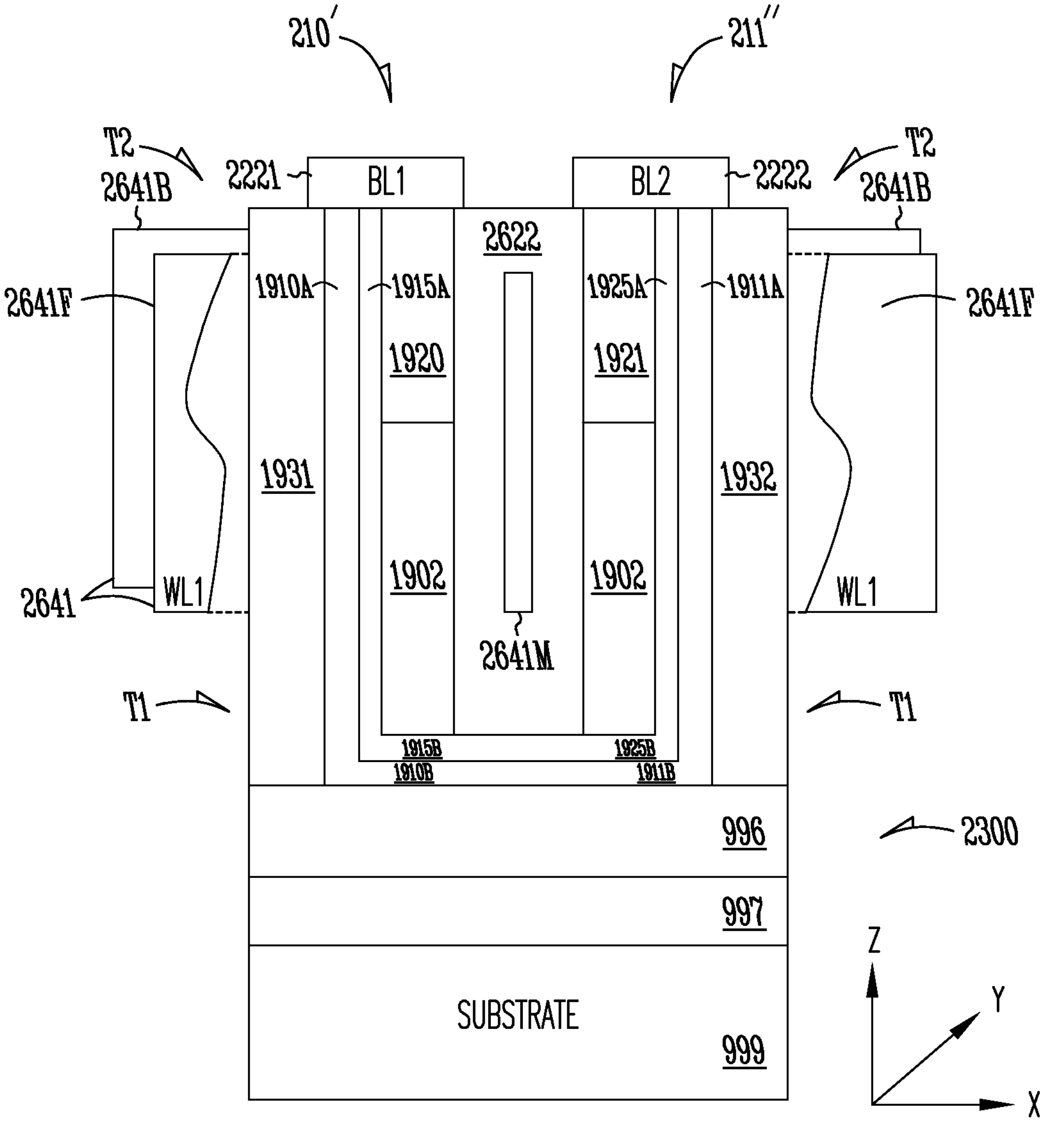

FIG. 28 shows a side view (e.g., cross-sectional view) of a portion of memory device 2300 including the locations of conductive portion 2641M between memory cells 210' and 211'. For simplicity, description of the elements of memory device 2300 shown in FIG. 28 is not repeated. In FIG. 28, conductive portion 2641M can be located between charge storage structure 1902 of memory cells 210' and 211' to form a shielding structure. This shielding structure can improve the operation (e.g., reduce coupling interference between charge storage structures of adjacent memory cells) of memory device 2300.

The description of forming memory device 2300 with reference to FIG. 23 through FIG. 28 can include other processes to form a complete memory device. Such processes are omitted from the above description so as to not obscure the subject matter described herein.

Figure 29A:
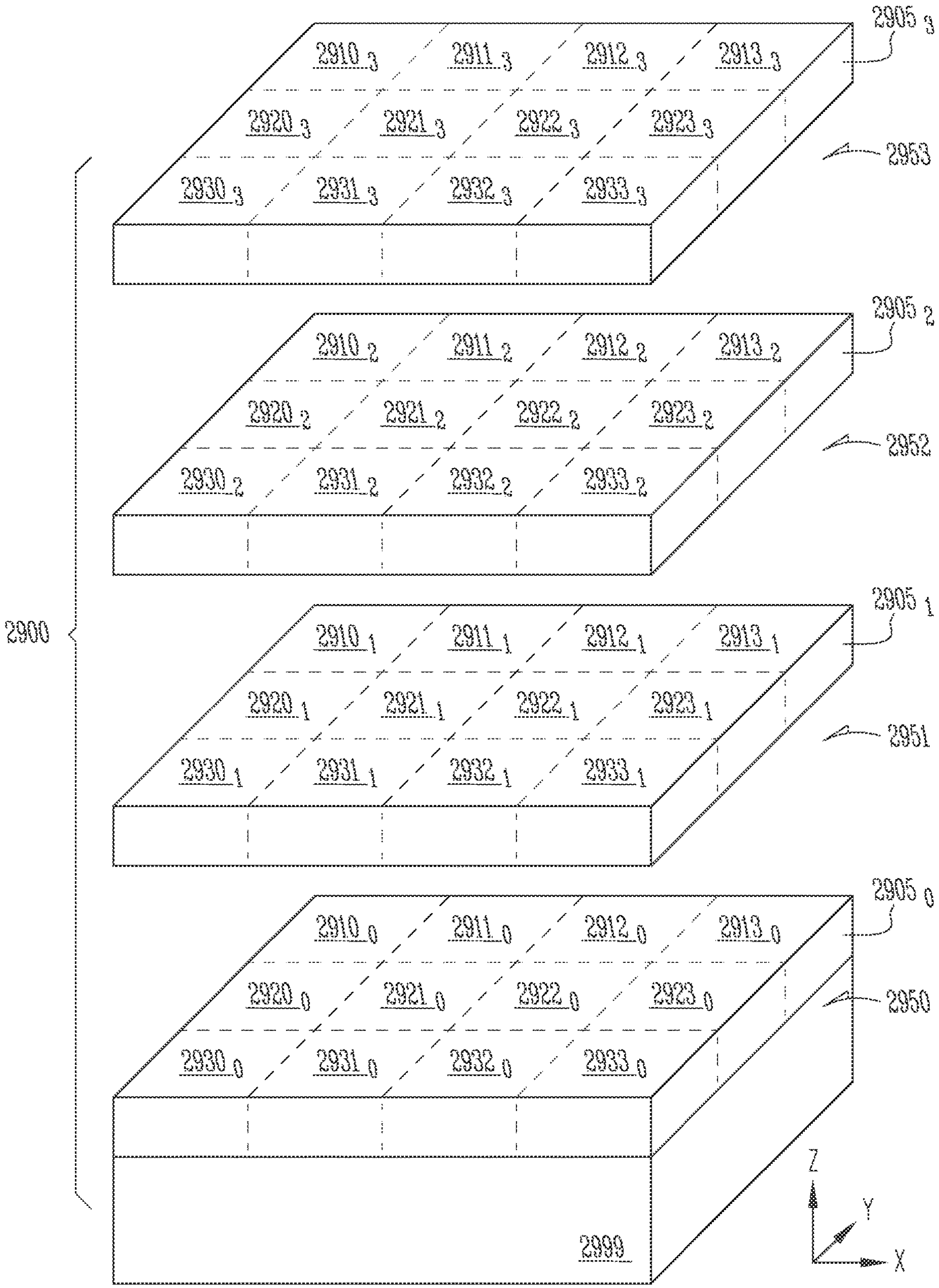
FIG. 29A, FIG. 29B, and FIG. 29C show different views of a structure of a memory device including multiple decks of memory cells, according to some embodiments described herein.
Figure 29B:
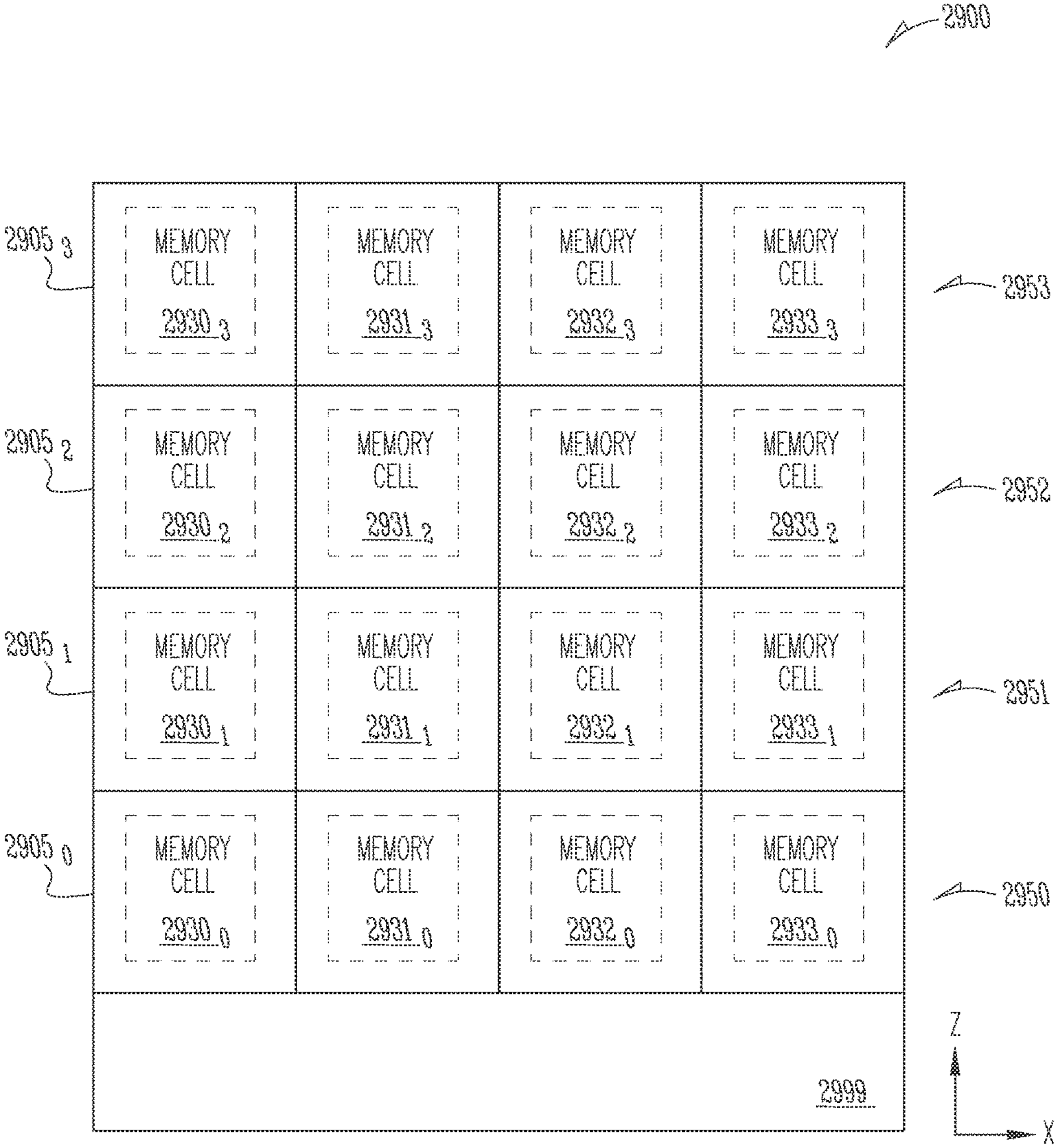
Figure 29C:
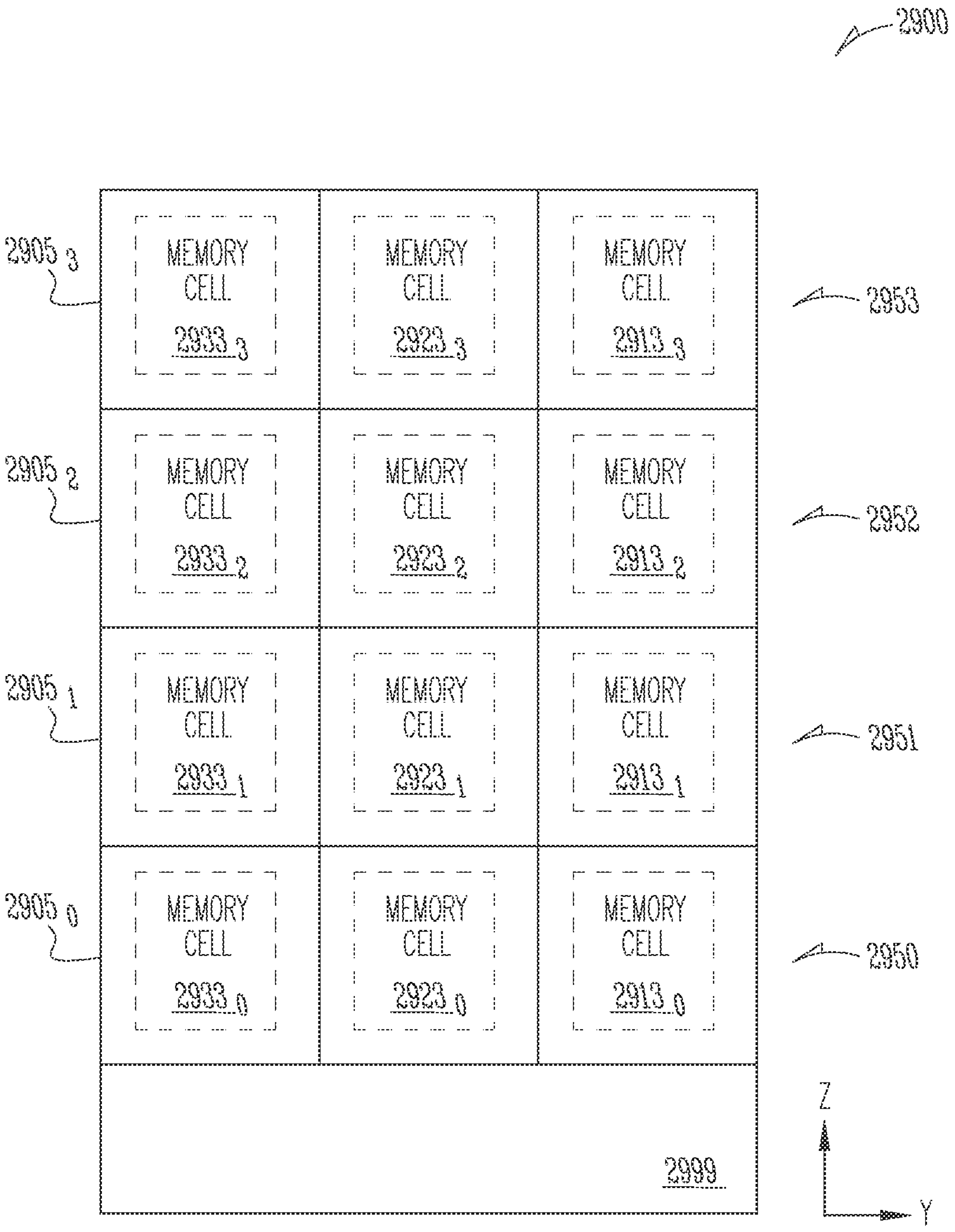

FIG. 29A, FIG. 29B, and FIG. 29C show different views of a structure of a memory device 2900 including multiple decks of memory cells, according to some embodiments described herein. FIG. 29A shows an exploded view (e.g., in the Z-direction) of memory device 2900. FIG. 29B shows a side view (e.g., cross-sectional view) in the X-direction and the Z-direction of memory device 2900. FIG. 29C shows a side view (e.g., cross-sectional view) in the Y-direction and the Z-direction of memory device 2900.

As shown in FIG. 29A, memory device 2900 can include decks (decks of memory cells) 2905$_0$, 2905$_1$, 2905$_2$, and 2905$_3$ that are shown separately from each other in an exploded view to help ease of viewing the deck structure of memory device 2900. In reality, decks 2905$_0$, 2905$_1$, 2905$_2$, and 2905$_3$ can be attached to each other in an arrangement where one deck can be formed (e.g., stacked) over another deck over a substrate (e.g., a semiconductor (e.g., silicon) substrate) 2999. For example, as shown in FIG. 29A, decks 2905$_0$, 2905$_1$, 2905$_2$, and 2905$_3$ can be formed in the Z-direction perpendicular to substrate 2999 (e.g., formed vertically in the Z-direction with respect to substrate 2999).

As shown in FIG. 29A, each of decks 2905$_0$, 2905$_1$, 2905$_2$, and 2905$_3$ can have memory cells arranged in the X-direction and the Y-direction (e.g., arranged in rows in the X-direction and in columns in the Y-direction). For example, deck 2905$_0$ can include memory cells 2910$_0$, 2911$_0$, 2912$_0$, and 2913$_0$ (e.g., arranged in a row), memory cells 2920$_0$, 2921$_0$, 2922$_0$, and 2923$_0$ (e.g., arranged in a row), and memory cells 2930$_0$, 2931$_0$, 2932$_0$, and 2933$_0$ (e.g., arranged in a row).

Deck 2905$_1$ can include memory cells 2910$_1$, 2911$_1$, 2912$_1$, and 2913$_1$ (e.g., arranged in a row), memory cells 2920$_1$, 2921$_1$, 2922$_1$, and 2923$_1$ (e.g., arranged in a row), and memory cells 2930$_1$, 2931$_1$, 2932$_1$, and 2933$_1$ (e.g., arranged in a row).

Deck 2905$_2$ can include memory cells 2910$_2$, 2911$_2$, 2912$_2$, and 2913$_2$ (e.g., arranged in a row), memory cells 2920$_2$, 2921$_2$, 2922$_2$, and 2923$_2$ (e.g., arranged in a row), and memory cells 2930$_2$, 2931$_2$, 2932$_2$, and 2933$_2$ (e.g., arranged in a row).

Deck 2905$_3$ can include memory cells 2910$_3$, 2911$_3$, 2912$_3$, and 2913$_3$ (e.g., arranged in a row), memory cells 2920$_3$, 2921$_3$, 2922$_3$, and 2923$_3$ (e.g., arranged in a row), and memory cells 2930$_3$, 2931$_3$, 2932$_3$, and 2933$_3$ (e.g., arranged in a row).

As shown in FIG. 29A, decks 2905$_0$, 2905$_1$, 2905$_2$, and 2905$_3$ can be located (e.g., formed vertically in the Z-direction) on levels (e.g., portions) 295$_0$, 295$_1$, 295$_2$, and 295$_3$, respectively, of memory device 290$_0$. The arrangement of decks 2905$_0$, 2905$_1$, 2905$_2$, and 2905$_3$ forms a 3-dimensional (3-D) structure of memory cells of memory device 2900 in that different levels of the memory cells of memory device 2900 can be located (e.g., formed) in different levels (e.g., different vertical portions) 295$_0$, 295$_1$, 295$_2$, and 295$_3$ of memory device 290$_0$. Decks 2905$_0$, 2905$_1$, 2905$_2$, and 2905$_3$ can be formed one deck at a time. For example, decks 2905$_0$, 2905$_1$, 2905$_2$, and 2905$_3$ can be formed sequentially in the order of decks 2905$_0$, 2905$_1$, 2905$_2$, and 2905$_3$ (e.g., deck 2905$_0$ is formed first and deck 2905$_3$ is formed last). In this example, the memory cell of one deck (e.g., deck 2905$_1$) can be formed either after formation of the memory cells of another deck (e.g., deck 2905$_0$) or before formation of the memory cells of another deck (e.g., deck $2905_2$). Alternatively, decks $2905_0$, $2905_1$, $2905_2$, and $2905_3$ can be formed concurrently (e.g., simultaneously), such that the memory cells of decks $2905_0$, $2905_1$, $2905_2$, and $2905_3$ can be concurrently formed. For example, the memory cells in levels $295_0$, $295_1$, $295_2$, and $295_3$ of memory device 2900 can be concurrently formed.

The structures of the memory cells of each of decks $2905_0$, $2905_1$, $2905_2$, and $2905_3$ can include the structures of the memory cells described above with reference to FIG. 1 through FIG. 28. For example, the structures of the memory cells of decks $2905_0$, $2905_1$, $2905_2$, and $2905_3$ can include the structure of the memory cells of memory devices 200, 900, and 2300.

Memory device 2900 can include data lines (e.g., bit lines) and access lines (e.g., word lines) to access the memory cells of decks $2905_0$, $2905_1$, $2905_2$, and $2905_3$. For simplicity, data lines and access lines of memory cells are omitted from FIG. 29A. However, the data lines and access lines of memory device 2900 can be similar to the data lines and access lines, respectively, of the memory devices described above with reference to FIG. 1 through FIG. 28.

FIG. 29A shows memory device 2900 including four decks (e.g., $2905_0$, $2905_1$, $2905_2$, and $2905_3$) as an example. However, the number of decks can be different from four. FIG. 29A shows each of decks $2905_0$, $2905_1$, $2905_2$, and $2905_3$ including one level (e.g., layer) of memory cells as an example. However, at least one of the decks (e.g., one or more of decks $2905_0$, $2905_1$, $2905_2$, and $2905_3$) can have two (or more) levels of memory cells. FIG. 29A shows an example where each of decks $2905_0$, $2905_1$, $2905_2$, and $2905_3$ includes four memory cells (e.g., in a row) in the X-direction and three memory cells (e.g., in a column) in the Y-direction. However, the number of memory cells in a row, in a column, or both, can vary.

The illustrations of apparatuses (e.g., memory devices 100, 200, 900, 2300, and 2900) and methods (e.g., operations of memory devices 100 and 200, and methods of forming memory devices 900 and 2300) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 900, 2300, and 2900) or a system (e.g., an electronic item that can include any of memory devices 100, 200, 900, 2300, and 2900).

Any of the components described above with reference to FIG. 1 through FIG. 29C can be implemented in a number of ways, including simulation via software. Thus, apparatuses (e.g., memory devices 100, 200, 900, 2300, and 2900) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, 900, 2300, and 2900) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 29C include apparatuses and methods of forming the apparatuses. One of the apparatuses includes a data line, a memory cell coupled to the data line, a ground connection, and a conductive line. The memory cell includes a first transistor and a second transistor. The first transistor includes a first region electrically coupled to the data line, and a charge storage structure electrically separated from the first region. The second transistor includes a second region electrically coupled to the charge storage structure and the data line. The ground connection is coupled to the first region of the first transistor. The conductive line is electrically separated from the first and second regions and spans across part of the first region of the first transistor and part of the second region of the second transistor and forming a gate of the first and second transistors. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A method comprising:
forming levels of materials over a substrate, the levels of materials including a dielectric material;
forming first trenches in the dielectric material by removing part of the levels of materials to provide a first remaining part of the levels of materials, such that each of the first trenches includes a length in a first direction, a first side wall formed by a first portion of the dielectric material, and a second side wall formed by a second portion of the dielectric material;
forming materials in the first trenches; and
forming second trenches across the first remaining part the levels of materials to form memory cells from a second remaining part of the levels of materials, such that a first memory cell of the memory cells is adjacent a portion of the first side wall of a trench of the first trenches, and a second memory cell of the memory cells is adjacent a portion of the second side wall of the trench of the first trenches.

2. The method of claim 1, wherein each of the memory cells includes a first transistor coupled to a second transistor, the first transistor includes a first portion of the materials, and the second transistor includes a second portion of the materials.

3. The method of claim 1, wherein forming the materials in the first trenches includes forming an additional dielectric material in each of the first trenches, such that a portion of the additional material is between the first memory cell and the second memory cell after the second trenches are formed.

4. The method of claim 1, wherein forming the levels of materials includes:
forming a conductive material over the substrate;
forming a semiconductor material over the conductive material; and
forming the dielectric material over the semiconductor material.

5. The method of claim 1, wherein the conductive material is formed such that each of the memory cells includes a portion electrically coupled to the conductive material.

6. The method of claim 1, wherein each of the memory cells includes a charge storage structure formed from a material of the materials.

7. The method of claim 6, wherein each of the memory cells includes a portion formed from a portion of the materials in first trenches, and the portion of each of the memory cells comprises at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_a$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_2O_a$), indium gallium silicon oxide (InGaSiO), and gallium phosphide (GaP).

8. The method of claim 1, further comprising:
forming access lines after the second trenches are formed, such that each of the access lines is electrically separated from the memory cells.

9. The method of claim 8, further comprising:
forming data lines after the access lines are formed, such that each of the data lines has a length in the first direction, and each of the data lines is electrically coupled to at least a portion of a remaining part of the levels of materials.

10. The method of claim 1, further comprising:
forming a first conductive line in a first trench of the second trenches;
forming a second conductive line in a second trench of the second trenches; and
forming a conductive portion electrically coupled to the first and second conductive lines, wherein the conductive portion is located between the first and second memory cells.

11. A method comprising:
forming a ground connection;
forming a first transistor of a memory cell, including forming a first region coupled to the ground connection and forming a charge storage structure separated from the first region; and
forming a second transistor of the memory cell including forming a second region coupled to the charge storage structure;
forming a conductive line separated from the first and second regions, part of the conductive line spanning across part of the first region of the first transistor and part of the second region of the second transistor and forming a gate of the first and second transistors; and
forming a data line coupled to the first region and the second region.

12. The method of claim 11, wherein the first region includes a channel region of the first transistor, and the second region includes a channel region of the second transistor.

13. The method of claim 11, wherein the first region and the second region have different conductivity types.

14. The method of claim 11, wherein the first region includes p-type semiconductor material and the second region includes n-type semiconductor material.

15. The method of claim 11, wherein the second region comprises a semiconducting oxide material.

16. A method comprising:
forming a conductive plate;
forming a memory cell over the conductive plate, wherein forming the memory cell includes:
forming a memory element;
forming a channel region contacting the memory element; and
forming a semiconductor material coupled to the conductive plate;
forming conductive line separated from the memory element, the channel region, and the semiconductor material, part of the conductive line spanning across part of the semiconductor material and the channel region; and
forming a conductive region coupled to the channel region and the semiconductor material.

17. The method of claim 16, wherein the channel region is formed over the memory element.

18. The method of claim 16, wherein the semiconductor material and the channel region have different conductivity types.

19. The method of claim 16, wherein the conductive region is part of a data line of a memory device, and the conductive line is part of a word line of the memory device.

20. The method of claim 19, wherein the conductive plate includes a ground plate of the memory device.

* * * * *